United States Patent [19]

Tsutsui et al.

[11] Patent Number: 6,009,545
[45] Date of Patent: Dec. 28, 1999

[54] SYSTEM FOR ANALYZING A FAILURE IN A SEMICONDUCTOR WAFER BY CALCULATING CORRELATION COEFFICIENT BETWEEN COLLATED DATA OF DEFECTS PER PRESCRIBED UNIT AND FAILURES PER PRESCRIBED UNIT

[75] Inventors: Toshikazu Tsutsui; Tohru Koyama; Fumihito Ohta; Yasukazu Mukogawa; Masaaki Furuta; Yohji Mashiko, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 09/182,526

[22] Filed: Oct. 30, 1998

Related U.S. Application Data

[62] Division of application No. 08/619,396, Mar. 21, 1996, Pat. No. 5,844,850.

[30] Foreign Application Priority Data

Apr. 25, 1995 [JP] Japan ................................ 7-101181

[51] Int. Cl.[6] .................................................. G06F 11/00
[52] U.S. Cl. ............................ 714/718; 714/799; 365/200
[58] Field of Search ............................. 702/35; 714/736, 714/704, 718, 799; 324/752, 765; 365/200

[56] References Cited

U.S. PATENT DOCUMENTS

| | | | |
|---|---|---|---|
| 4,460,997 | 7/1984 | Harns ................................ | 714/704 |
| 4,801,869 | 1/1989 | Sprogis .............................. | 324/765 |
| 4,985,927 | 1/1991 | Norwood et al. ................. | 382/149 |
| 5,018,212 | 5/1991 | Manns et al. ..................... | 382/145 |
| 5,038,048 | 8/1991 | Maeda et al. ..................... | 250/559.41 |
| 5,404,410 | 4/1995 | Tojo et al. ........................ | 382/144 |
| 5,493,236 | 2/1996 | Ishii et al. ........................ | 324/752 |
| 5,497,381 | 3/1996 | O'Donoghue et al. .......... | 714/736 |
| 5,801,965 | 9/1998 | Takagi et al. .................... | 702/35 |

FOREIGN PATENT DOCUMENTS

| | | |
|---|---|---|
| 0555018 | 8/1993 | European Pat. Off. . |
| 61144838 | 7/1986 | Japan . |
| 405322784 | 12/1993 | Japan . |
| 6-275688 | 9/1994 | Japan . |

OTHER PUBLICATIONS

"Expert System for Semiconductor Failure Analysis Using ARES/DIAG", by H. Nakawatase et al., *Toshiba Review*, 1994, vol. 49, No. 8, pp. 563–566.

"In–Line Monitoring Technology Using Memory Failure Analysis Expert System", by Tohru Tsujide, 1993.

*Primary Examiner*—Albert De Cady
*Assistant Examiner*—David Ton
*Attorney, Agent, or Firm*—McDermott, Will & Emery

[57] ABSTRACT

Data containing defect position coordinates obtained based on the result of physical inspection of foreign material, a defect or the like at the surface of a semiconductor wafer by a defect inspecting apparatus is stored. Also stored is data of physical coordinates obtained based on fail bit data from a tester. Data indicating an additional failure region is produced by an additional failure region estimating apparatus based on the fail bit data, and is stored. Collation produces data of corrected physical position coordinates by adding the stored data of limitation by failure mode to the stored data of physical position coordinates, and collates the data of corrected physical position coordinates with stored data of defect position coordinates. Accordingly, accuracy in collation is improved, and failure can be analyzed even if caused not by a defect located at an address of the failure obtained by the fail bit data but by a defect relating to the defect located at the address of a failure.

9 Claims, 12 Drawing Sheets

(a) POINT FAILURE
(b) LINE FAILURE

SYSTEM FOR ANALYZING A FAILURE IN A SEMICONDUCTOR WAFER BY CALCULATING CORRELATION COEFFICIENT BETWEEN COLLATED DATA OF DEFECTS PER PRESCRIBED UNIT AND FAILURES PER PRESCRIBED UNIT

This application is a divisional of application Ser. No. 08/619,396 filed Mar. 21, 1996 now U.S. Pat. No. 5,844,850.

BACKGROUND OF THE INVENTION

1. Field of the Invention

The present invention relates to an apparatus for analyzing a failure in a semiconductor wafer in which a plurality of chips each having a plurality of memory cells are formed, and a method thereof.

2. Description of the Background Art

A method of analyzing a failure in a semiconductor wafer in which a plurality of chips each having a plurality of memory cells (which are generally arranged in a matrix form of rows and columns) includes a method of testing an electric property of memory cells by a tester, indicating the resultant data in coordinate space of X (row) and Y (column) to produce a pattern of a failure (which is generally called a fail bit map (hereinafter referred to as an FBM)) corresponding to the cause of a failure, and estimating the cause of the failure using this FBM.

Therefore, the cause obtained with the FBM is a mere estimation of a three dimensional position of a failure and an electric abnormality at that position, that is, an estimation of what failure (such as leakage, open and short) is happening at which position.

In order to actually improve a failure, this is insufficient and the cause of a failure in a manufacturing process must be clarified.

A method based on the above consideration is proposed in Japanese Patent Laying-Open No. 6-275688.

This is a method in which physical inspection of foreign materials, defects and the like at a surface of a semiconductor wafer is carried out by a defect inspection apparatus for each process of a plurality of processes in a production line, an electric property of memory cells of each chip in the semiconductor wafer manufactured in the production line is tested by a tester to produce a fail bit data (FBM), the result of physical inspection of foreign materials, defects and the like is collated with the FBM, thereby estimating whether a failure is caused by foreign materials, defects and the like produced during the manufacturing process or not.

Accordingly, the cause of a failure is not always located at the position of the failure found by the test, and there are many cases where the cause of a failure is located at a position other than the position of the failure.

Furthermore, not all the foreign materials and defects produced during the manufacturing process cause a failure, and whether foreign materials or defects cause a failure or not depends on the position, size and the like thereof.

Consequently, in the method proposed in the above mentioned document, the position of a failure found from the test by a tester is merely collated with each of the positions of foreign materials, defects or the like, and therefore, sufficient failure analysis cannot be performed.

SUMMARY OF THE INVENTION

The present invention is provided in view of the above mentioned problems, and it is an object of the present invention to provide an apparatus for analyzing a failure in a semiconductor wafer and a method thereof in which failure can be analyzed as well as a defect causing a failure found by the tester can be recognized even if the failure is not caused by a defect located at an address of the failure obtained by the tester but by a defect at a position relating to the defect located at the address of the failure without mistaking the defect which does not affect the failure found by the tester for the cause of the failure.

An apparatus for analyzing a failure in a semiconductor wafer in accordance with one aspect of the present invention includes an additional failure region estimating device for producing data of limitation by failure mode indicating an additional failure region, based on fail bit data resulting from the test of an electric property of memory cells in each chip of the semiconductor wafer manufactured in the production line having a plurality of processes; and a collating device for receiving data of defect position coordinates containing coordinates of defect positions obtained by physical inspection of foreign materials, defects or the like at a surface of the semiconductor wafer for each process of the production line, data of physical position coordinates indicating a position of a failure based on the fail bit data, and data of limitation by failure mode to produce data of corrected physical position coordinates obtained by adding the data of limitation by failure mode to the data of physical position coordinates, and then collating the data of corrected physical position coordinates with the data of defect position coordinates.

As described above, the data of corrected physical position coordinates is obtained based on the data of physical position coordinates and the data of limitation by failure mode, and the data of corrected physical position coordinates and the data of defect position coordinates are collated with each other, whereby accuracy in collation is improved.

Consequently, a failure can be analyzed even if the failure is not caused by a defect located at an address of the failure obtained by fail bit data but by a defect at a position relating to the defect located at the address of the failure, resulting in improvement in accuracy in estimation.

An apparatus for analyzing a failure in a semiconductor wafer in accordance with a second aspect of the present invention includes a device for calculating the number of defects per prescribed unit based on data containing defect position coordinates obtained from physical inspection of foreign materials, defects or the like at the surface of the semiconductor wafer for each process of the production line having a plurality of processes, and outputting the calculated number of defects as data of the number of defects per prescribed unit; a device for calculating the number of failures per prescribed unit based on fail bit data obtained from the test of an electric property of memory cells of each chip in the semiconductor wafer manufactured in the production line, and outputting data of the number of failures per prescribed unit; and a device for receiving the data of the number of defects per prescribed unit and the data of the number of failures per prescribed unit and collating these data with each other to calculate correlation coefficient between these data by performing an operation.

As described above, data of the number of defects per prescribed unit and data of the number of failures per prescribed unit can be collated with each other with respect to their distributions, whereby estimation of the process producing the cause of a failure extending over a region can be facilitated.

An apparatus for analyzing a failure in a semiconductor wafer in accordance with a third aspect of the present invention includes a device for calculating the number of defects such as foreign materials and defects by size per prescribed unit based on data containing defect size and defect position coordinates obtained from physical inspection of foreign materials, defects or the like at the surface of the semiconductor wafer for each process of the production line having a plurality of processes, and outputting the calculated number of the defects as data of the number of defects by size per prescribed unit; a device for calculating the number of failures per prescribed unit based on fail bit data obtained from the test of an electric property of memory cells of each chip in the semiconductor wafer manufactured in the production line, and outputting data of the number of failures per prescribed unit; and a device for receiving the data of the number of defects by size per prescribed unit and the data of the number of failures per prescribed unit, collating these data with each other, and calculating correlation coefficient between these data by performing an operation.

As described above, data of the number of defects by size per prescribed unit and data of the number of failures per prescribed unit can be collated with each other with respect to their distributions, thereby estimation of the process producing the cause of a failure extending over a region can be facilitated.

An apparatus for analyzing a failure in a semiconductor wafer in accordance with a fourth aspect of the present invention includes a device for calculating the number of defects such as foreign materials, defects or the like by category per prescribed unit, based on data containing categories of defect shape and defect position coordinates obtained from physical inspection of foreign materials, defects or the like at the surface of the semiconductor wafer for each process of the production line having a plurality of processes, and outputting the calculated number of defects by category as data of the number of defects by category per prescribed unit; a device for calculating the number of failures per prescribed unit based on fail bit data obtained from the test of an electric property of memory cells of each chip in the semiconductor wafer manufactured in the production line, and outputting data of the number of failures per prescribed unit; and a device for receiving the data of the number of defects by category per prescribed unit and the data of the number of failures per prescribed unit, collating these data with each other, and calculating correlation coefficient between these data by performing an operation.

As described above, data of the number of defects by category per prescribed unit and data of the number of failures per prescribed unit can be collated with each other with respect to their distributions, whereby estimation of the process producing the cause of a failure extending over a region can be facilitated.

A method of analyzing a failure in a semiconductor wafer in accordance with a fifth aspect of the present invention includes the steps of introducing data containing defect position coordinates obtained based on physical inspection of foreign materials, defects or the like at the surface of the semiconductor wafer for each process in the production line having a plurality of processes; introducing fail bit data obtained based on the test of an electric property of memory cells of each chip in the semiconductor wafer manufactured in the production line; producing data of physical position coordinates indicating a position of a failure based on the fail bit data; producing data of limitation by failure mode indicating an additional failure region based on the fail bit data; producing data of corrected physical position coordinates based on both the data of physical position coordinates and the data of limitation by failure mode; and collating the data of corrected physical position coordinates and the data of defect position coordinates with each other.

As described above, data of corrected physical position coordinates is obtained based on data of physical position coordinates and data of limitation by failure mode, and the data of corrected physical position coordinates and data of defect position coordinates are collated with each other, thereby improving accuracy in collation.

Consequently, a failure can be analyzed even if the failure is not caused by a defect located at an address of the failure obtained by fail bit data but by a defect at a position relating to the defect located at the address of the failure, resulting in improvement in accuracy in estimation.

A method of analyzing a failure in accordance with a sixth aspect of the present invention includes the steps of introducing data containing defect position coordinates obtained based on physical inspection of foreign materials, defects or the like at the surface of a semiconductor wafer for each process in the production line having a plurality of processes; calculating the number of defects per prescribed unit based on the data containing defect position coordinates to produce data of the number of defects per prescribed unit; introducing fail bit data obtained based on the test of an electric property of memory cells of each chip in the semiconductor wafer manufactured in the production line; calculating the number of failures per prescribed unit based on the fail bit data to produce data of the number of failures per prescribed unit; and collating the data of the number of defects per prescribed unit and the data of the number of failures per prescribed unit with each other to calculate correlation coefficient between these data.

As described above, data of the number of defects per prescribed unit and data of the number of failures per prescribed unit can be collated with each other with respect to their distributions to calculate correlation coefficient between these data, whereby estimation of the process producing the cause of a failure extending over a region can be facilitated.

A method of analyzing a failure in a semiconductor wafer in accordance with a seventh aspect of the present invention includes the steps of introducing data containing defect size and defect position coordinates obtained based on physical inspection of foreign materials, defects or the like at a surface of semiconductor wafer for each process in the production line having a plurality of processes; calculating the number of defects such as foreign materials, defects or the like by size per prescribed unit based on the data containing defect size and defect position coordinates to produce data of the number of defects by size per prescribed unit; introducing fail bit data obtained based on the test of an electric property of memory cells of each chip in the semiconductor wafer manufactured in the production line; calculating the number of failures per prescribed unit based on the fail bit data to produce data of the number of failures per prescribed unit; and collating the data of the number of defects by size per prescribed unit and the data of the number of failures per prescribed unit with each other to calculate correlation coefficient between these data.

As described above, data of the number of defects by size per prescribed unit and data of the number of failures per prescribed unit can be collated with each other to calculate correlation coefficient between these data, so that their distributions can be collated with each other, whereby estimation of the process producing the cause of a failure extending over a region can be facilitated.

A method of analyzing a failure in a semiconductor wafer in accordance with an eighth aspect of the present invention includes the steps of introducing data containing categories of defect shape and defect position coordinates obtained based on physical inspection of foreign materials, defects or the like at a surface of the semiconductor wafer for each process of the production line having a plurality of processes; calculating the number of defects such as foreign materials, defects or the like by category per prescribed unit based on the data containing categories and defect position coordinates to produce data of the number of defects by category per prescribed unit; introducing fail bit data obtained based on the test of an electric property of memory cells of each chip in the semiconductor wafer manufactured in the production line; calculating the number of failures per prescribed unit based on the fail bit data to produce data of the number of failures per prescribed unit; and collating the data of the number of defects by category per prescribed unit and the data of the number of failures per prescribed unit with each other to calculate correlation coefficient between these data.

As described above, data of the number of defects by category per prescribed unit and data of the number of failures per prescribed unit are collated with each other to calculate correlation coefficient between these data, so that their distributions can be collated with each other, whereby estimation of the process producing the cause of a failure having a region can be facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
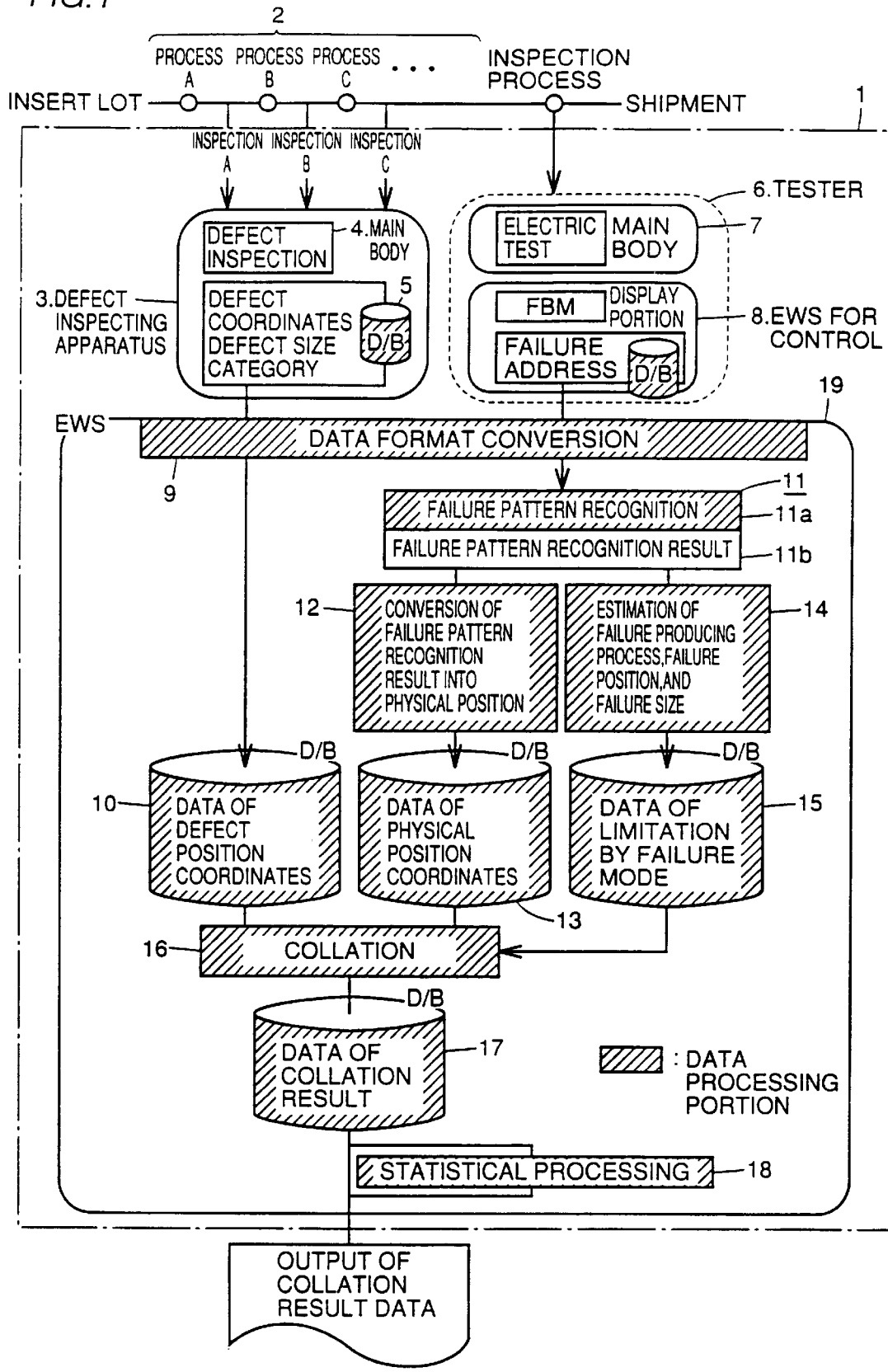
FIG. 1 is a block diagram showing a first embodiment of th resent invention.

FIG. 1 is a block diagram showing an apparatus 1 for analyzing a failure in a semiconductor wafer in accordance with a first embodiment of the present invention. In FIG. 1, a production line 2 of a semiconductor device includes a process A, a process B, a process C . . . , and is constituted by a collection of semiconductor manufacturing apparatuses placed for respective processes. In the present embodiment, a semiconductor device manufactured in the production line 2 is a semiconductor memory device having a memory region in which a plurality of memory cells are arranged in a matrix form of X and Y. This semiconductor memory device is intended for a DRAM, for example, and a semiconductor wafer is intended for a wafer in which a plurality of chips of this semiconductor memory device are formed.

A defect inspecting apparatus 3 detects foreign materials, defects or the like (hereinafter referred to as defects generically, and the term "defect" herein could indicate only foreign material, only defect, or both foreign material and defect) at a surface of a semiconductor wafer, that is, detects them by physically inspecting their external appearance (optical inspection). This defect inspecting apparatus 3 includes a main body 4 having an inspection portion for performing defect inspection and an operation portion for performing an operation of the result of inspection from the inspection portion; and a data base (D/B) 5 for accumulating (storing) defect position coordinates (including at least identification information (ID) of an inspected semiconductor wafer, an inspected process, and defect position coordinates indicating defect positions at a surface of the semiconductor wafer, and data including these information is uniquely and generically called defect coordinates), defect size, category and the like. The defect inspecting apparatus 3 may be provided for each process, or one common defect inspecting apparatus 3 may be provided. KLA 21 (manufactured by KLA Inc.), SURF SCAN 7* (manufactured by TENCON Inc.), WI880 (manufactured by Hitachi, Ltd.) or the like is used for defect inspecting apparatus 3, for example.

It is noted that the above mentioned foreign materials includes foreign materials produced from an apparatus during manufacturing process, foreign materials remaining after a process, etching residue, dust from environment, foreign materials from human being and the like, and the size thereof ranges from 0.1 $\mu$m to hundreds of $\mu$m. The above mentioned defects includes, for example, defective contact and defective pattern produced by photography, etching, stain (thin oxide film), change in color or the like.

A tester 6 performs a test (electric test) to measure an electric property of memory cells in each chip of a semiconductor wafer manufactured in production line 2, such as a test of writing data into a memory cell and then verifying that the data is written into and read from the memory cell correctly, so as to produce a fail bit map (hereinafter referred to as FBM) which represents the result of the test as a failure pattern corresponding to the cause of a failure in the coordinate space of X/Y. This tester 6 includes a main body 7 for carrying out an electric test and performing an operation of the result of the test; and a computer work station 8 for control (hereinafter referred to as an EWS for control) having a display portion for displaying an FBM obtained from main body 7, a data base (D/B) for accumulating (storing), for example, FBM data (a testing method, an address of a failure (which is designated in a matrix of wiring in a memory), and the like. For example, J937 (Manufactured by Teradyne Inc.), T5365P (Manufactured by Advantest Inc.) or the like is used for the tester 6.

Data format converting means 9 receives data resulting from inspection and operation in defect inspecting apparatus 3 (This data contains defect position coordinates, defect size, category and the like for each process, and may be data which has once stored in data base 5, wherein defect position coordinates are represented as physical position coordinates of distances X1 and Y1 (for example, $\mu$m) from the origin which is preset in the chip, wherein X1 is a lateral direction from the origin, and Y1 is a longitudinal direction from the origin, and the physical position coordinates also indicate which chip is of interest, and refer to coordinates of one or a plurality of physical positions) and data resulting from the test and operation in tester 6 (This data includes a testing method and an address of a failure, wherein an address of a failure is represented as a logical address (x2 and y2 (no unit)) in a chip of the semiconductor wafer. An address in a row direction from the origin of an address is represented by x2, and an address in a column direction from the origin of an address is represent by y2. A logical address herein generically refers to one or a plurality of logical addresses), and converts each data based on a prescribed format.

First storage means 10 is a data base for accumulating (storing) data resulting from conversion of data from defect inspecting apparatus 3 by data format converting means 9 (This converted data is hereinafter referred to as data of defect position coordinates, for convenience. In this data of defect position coordinates, data indicating defect position coordinates are represented as physical position coordinates of distances X1 and Y1 (for example, $\mu$m) from the origin which is preset in a chip, and physical position coordinates also indicate which chip is of interest, and refer to coordinates of one or a plurality of physical positions by process.

Figure 2:
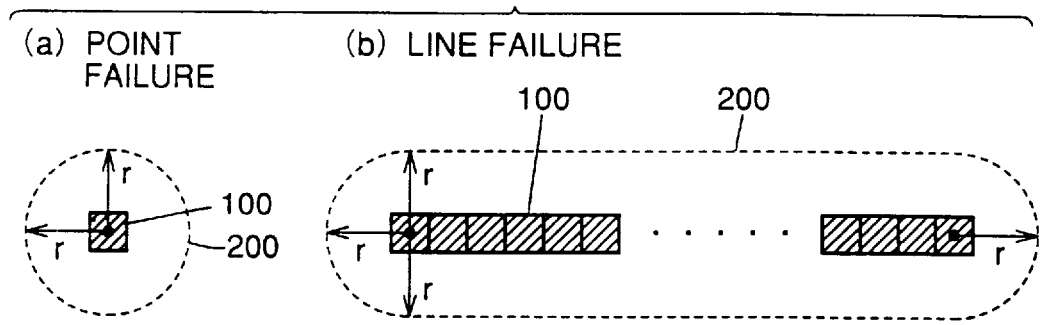
FIG. 2 is a diagram showing a region of FBM data for collation with data of defect position coordinates in accordance with the first embodiment of the present invention.

Failure pattern recognizing means 11 receives data (hereinafter referred to as FBM data, for convenience) resulting from conversion of data from tester 6 by data format converting means 9, recognizes and classifies a failure pattern based on this FBM data, and outputs the result as data of recognition, classification and position coordinates of the failure pattern (This data is hereinafter referred to as failure pattern recognition result data. The data of position coordinates is represented as a logical address in a chip of the semiconductor wafer.). Failure pattern recognizing means 11 includes an operational processing portion 11a for recognizing and classifying a failure pattern, and an output portion 11b for outputting the result obtained by operation performed by operational processing portion 11a as failure pattern recognition result data. In the processing of recognizing and classifying a failure pattern, whether a failure pattern is a point failure (see (a) of FIG. 2) which is a failure of a single memory cell, a line failure (see (b) of FIG. 2) which is a failure of a plurality of memory cells located in line, or a block failure (plane failure) which is a failure of a plurality of memory cells arranged in a matrix form, for example, is recognized for each chip, based on all the failure addresses in each chip of the semiconductor wafer which are included in data from tester 6 as point information represented by a crossing of a wiring matrix, and further, in the case of a line failure, the number of failures and length of each failure are recognized, and then, the failure is classified into a point failure, a line failure, a plane failure or the like. In FIG. 2, a reference numeral 100 indicates an FBM image of a failure pattern, and a reference numeral 200 indicates a collation region of FBM data for collation with data of defect position coordinates, which is a region defined by distance r (a value based on both accuracy in defect coordinates (stage accuracy) at the time of defect inspection performed by defect inspecting apparatus 3 and accuracy in wiring pattern dimension) from the center of FBM image 100.

Means 12 for converting data of position coordinates (represented as a logical address (x1 and y1) in a chip of a semiconductor wafer, and referring to one or a plurality of logical addresses) included in failure pattern recognition result data from failure pattern recognizing means 11 into physical position coordinates (referring to coordinate of one or a plurality of physical position) of distances X2 and Y2 (for example, $\mu$m, wherein X2 is a lateral distance from the origin and Y2 is a longitudinal distance from the origin) from the origin which is preset in a chip. Physical position coordinates also indicate which chip in the semiconductor wafer is of interest.

Second storage means 13 is a data base for accumulating (storing) data of physical position coordinates (referring generically to data of one or a plurality of physical position coordinates) from converting means 12.

Additional failure region estimating means 14 receives failure pattern recognition result data from failure pattern recognizing means 11; estimates (infers) a process which has produced the cause of a failure (based on the position of layer of a failure), position and size of a failure from the failure pattern recognition result data input according to set conditions which have been prepared by the technical experts based on experience, statistics and the like; estimates (infers) an additional failure region according to failure mode in a position of failure (a position on a circuit) obtained from the failure pattern recognition result data, and outputs the additional failure region as data of limitation by failure mode (state of a failure). The data of limitation by failure mode is data of an additional failure region specified by distances X3 and Y3 (X3 and Y3 represent physical position coordinates in $\mu$m, for example, wherein X3 is a lateral distance from the origin, and Y3 is a longitudinal distance from the origin. Physical position coordinates refer to coordinates of one or a plurality of physical positions) from the origin which allows identification of the chip in the semiconductor wafer and is preset in a chip.

It is noted that the set conditions are obtained by experience, statistics and the like based on the result of various tests performed by tester 6.

Figure 3:
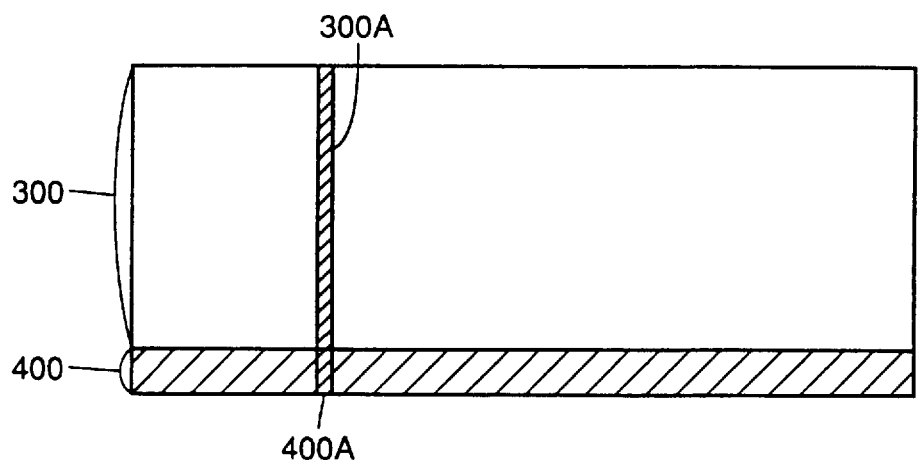
FIG. 3 is a diagram illustrating an additional failure region in accordance with the first embodiment of the present invention.

In addition, an additional failure region is a position where a defect (failure) might be generated which is recognized based on experience, statistics and the like with respect to a position of a failure (a position on a circuit) for each failure mode. For example, if data of failure pattern recognition result based on the result (showing a failure in wiring (bit line)) of the test performed by tester 6 is estimated to be a failure in wiring such as bit line (a position of a failure) caused by short of a pattern, a circuit for controlling a wiring (a wiring (bit line) control circuit in a peripheral circuit having no failure according to the result of the test performed by tester 6) is considered to be an additional failure region as failure conditions which might cause short. More specifically, referring to FIG. 3, if a position of a bit line 300A of a memory cell region 300 in a chip is recognized and estimated to be a failure based on the result of various tests performed by tester 6, a peripheral circuit 400A out of a plurality of peripheral circuits provided in a peripheral circuit region 400 connected to bit line 300A or controlling bit line 300A is considered to be an additional failure region.

Third storage means 15 is a data base for accumulating (storing) data of limitation by failure mode from additional failure region estimating means 14.

Collating means 16 receives data of defect position coordinates by process stored in the first storage means 10, data of physical position coordinates stored in the second storage means 13, and data of limitation by failure mode stored in the third storage means 15. This collating means 16 adds the data of limitation by failure mode to the data of physical position coordinates, that is, adds data of physical position coordinates showing an additional failure region obtained based on the data of the limitation by failure mode to data of physical position coordinates showing a position of a failure obtained based on the result of the test performed by tester 6, so as to produce data of conditional physical position coordinates. Then, collating means 16 adds a value r based on both accuracy in wiring pattern dimension in a chip and accuracy (stage accuracy) in defect coordinates in defect inspection performed by defect inspecting apparatus 3 to the data of conditional physical position coordinates, so as to produce data of corrected physical position coordinates designating a fixed range of error. Thereafter, collating means 16 collates the data of corrected physical position coordinates and data of defect position coordinates by process with each other, whereby the collation results by semiconductor wafer, by chip, by process and by failure pattern can be obtained.

Fourth storage means 17 is a data base for accumulating (storing) the collation result from the collating means 16 and outputs the stored collation result directly to display means (not shown) as required. It is noted that fourth storage means 17 may not output the stored collation result directly to the display means.

Figure 4:
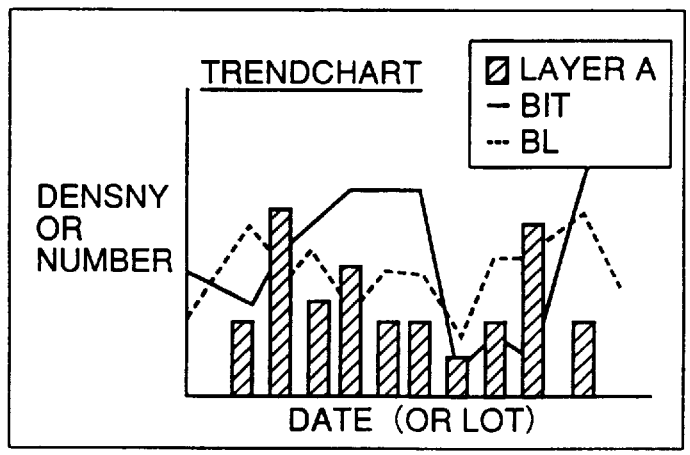
FIG. 4 is a diagram showing an example of data output from statistical processing means 18 in accordance with the first embodiment of the present invention.

Statistical processing means 18 statistically processes the collation result stored in fourth storage means 17 by semiconductor wafer, by chip, by process and by failure pattern to output the resultant data, and FIG. 4 shows an example of a display of the result of statistical processing. In FIG. 4, the numbers of failures of a layer (Layer A), a memory cell (BIT) and a bit line (BL) obtained for each day or for each lot are shown.

An analyzing apparatus 19 is constituted by a computer work station including data format converting means 9, first storage means 10, failure pattern recognizing means 11, position coordinates converting means 12, second storage means 13, additional failure region estimating means 14, third storage means 15, collating means 16, fourth storage means 17, and statistical processing means 18. This analyzing apparatus 19 receives data containing defect position coordinates obtained based on physical inspection of foreign materials, defects and the like at a surface of the semiconductor wafer for each process of the production line having a plurality of processes, and fail bit data obtained based on the test result of an electric property of memory cells in each chip of the semiconductor wafer manufactured in the production line. Then, analyzing apparatus 19 produces both data of limitation by failure mode indicating an additional failure region based on the fail bit data and data of corrected physical position coordinates obtained by adding the limitation data by failure mode to the data of physical position coordinates showing a position of a failure obtained based on the fail bit data. Thereafter, analyzing apparatus 19 collates the data of corrected physical position coordinates with data of defect position coordinates obtained based on the data containing defect position coordinates, and outputs the result of collation.

Figure 5:
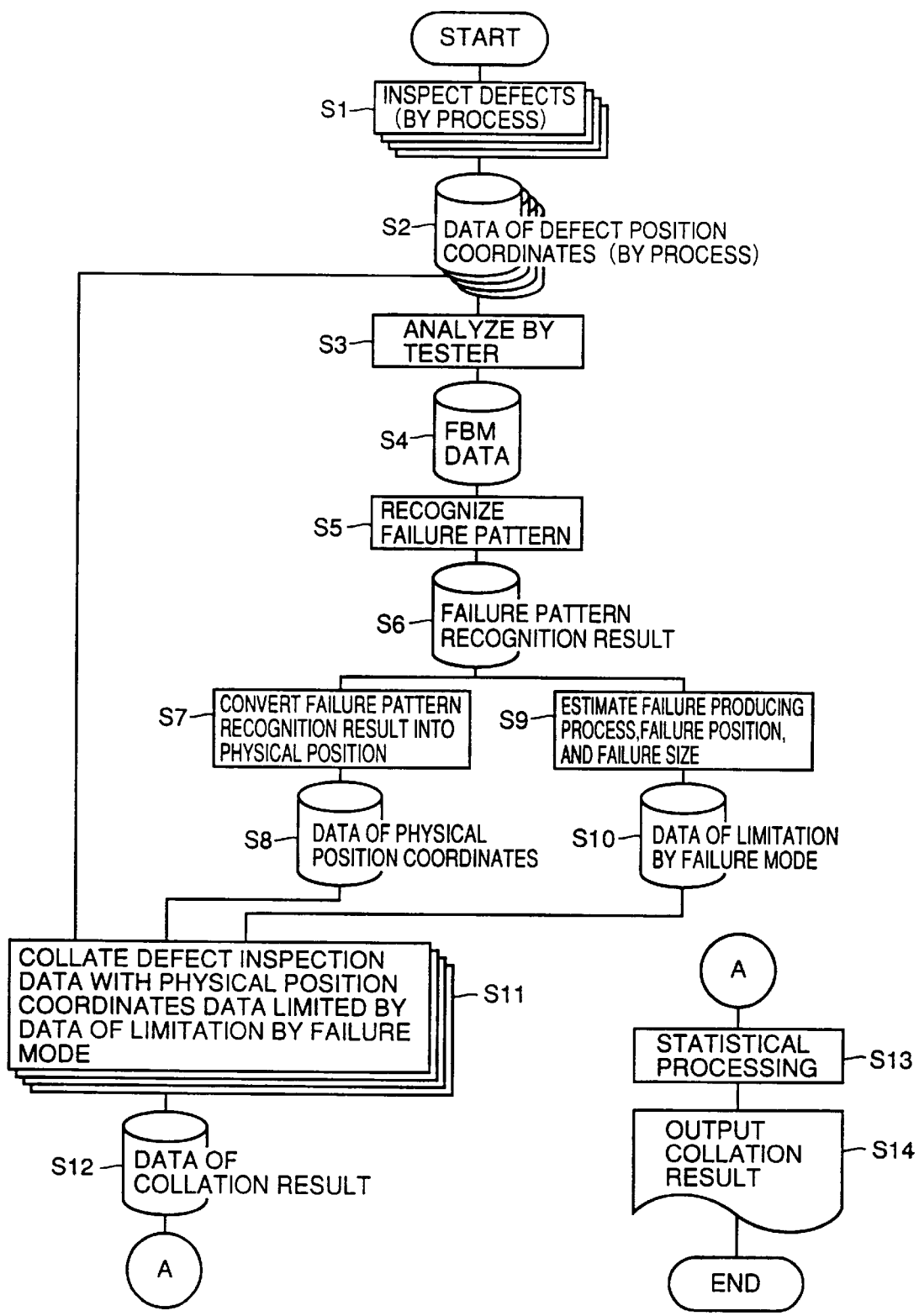
FIG. 5 is a flow chart showing processing procedure in an analyzing apparatus 19 in accordance with the first embodiment of the present invention.

A method of analyzing a failure in a semiconductor wafer by a failure analyzing apparatus having a structure as described above will now be described primarily in conjunction with a flow chart shown in FIG. 5.

First, in a step S1, defects at a surface of the semiconductor wafer are detected by physical inspection (optical inspection) of external appearance thereof by defect inspecting apparatus 3 for each process A, B, C . . . of production line 2, and resultant defect position coordinates are once stored in data base 5 by process or the like.

Then, in a step S2, the defect position coordinates obtained by defect inspecting apparatus 3 are data-converted based on a prescribed format by data format converting means 9, and the converted data is stored by process or the like in first storage means 10 as data of defect position coordinates.

On the other hand, in a step S3, an electric property of memory cells in each chip of the semiconductor wafer manufactured in production line 2 is tested by tester 6, and an FBM is produced as a result of the test. Then, in a step S4, this FBM data is once stored in data base 8.

Thereafter, in a step S5, the FBM data obtained from tester 6 is data-converted by data format converting means 9 based on a prescribed format, a failure pattern in the converted FBM data is recognized and classified by failure pattern recognizing means 11, and the result is stored as failure pattern recognition result data in a step S6.

At this time, a failure pattern is recognized for each chip as a point failure, a line failure or a plane failure based on all the failure addresses in each chip of the semiconductor wafer, which are contained in the data from tester 6 as point information represented by a crossing point in a wiring matrix, and then classified into a point failure, a line failure, a plane failure and the like.

Then, in a step S7, data of position coordinates (represented as a logical address) included in failure pattern recognition result data from failure pattern recognizing means 11 is converted into data of physical position coordinates by position coordinates converting means 12. This converted data of physical position coordinates is stored in second storage means 13 in a step S8.

On the other hand, in a step S9, an additional failure region according to a failure mode in a position of a failure (a position on a circuit) contained in the failure pattern recognition result data from failure pattern recognizing means 11 is estimated according to the preset condition by additional failure region estimating means 14 to produce data of limitation by state of a failure. This limitation data is stored in third storage means 15 in a step S10.

Then, in a step S11, collating means 16 produces data of conditional physical position coordinates by adding the limitation data by failure mode stored in third storage means 15 to the data of physical position coordinates stored in second storage means 13, and data of corrected physical position coordinates designating a fixed range of error is obtained from the data of conditional physical position coordinates, and further, the data of corrected physical position coordinates and the data of defect position coordinates by process stored in first storage means 10 are collated with each other, whereby the result of collation by semiconductor wafer, by chip, by process and by failure pattern is obtained. The data of the collation result is stored in fourth storage means 17 in a step S12.

Then, in a step S13, the collation result data stored in fourth storage means 17 is statistically processed by statistical processing means 18 by semiconductor wafer, by chip, by process and by failure pattern, and in a step S14, the result is output as the collation result in a form of a table, a graph or the like.

According to the apparatus for analyzing a failure in a semiconductor wafer having a structure as described above, a failure can be analyzed and a defect causing a failure obtained from tester 6 can be found without mistaking a defect which does not affect the failure obtained from tester 6 for the cause of the failure, even if the failure is not caused by a defect located at an address of the failure obtained from tester 6 but a defect at a position relating to the defect located at an address of the failure.

[Second Embodiment]

Figure 6:
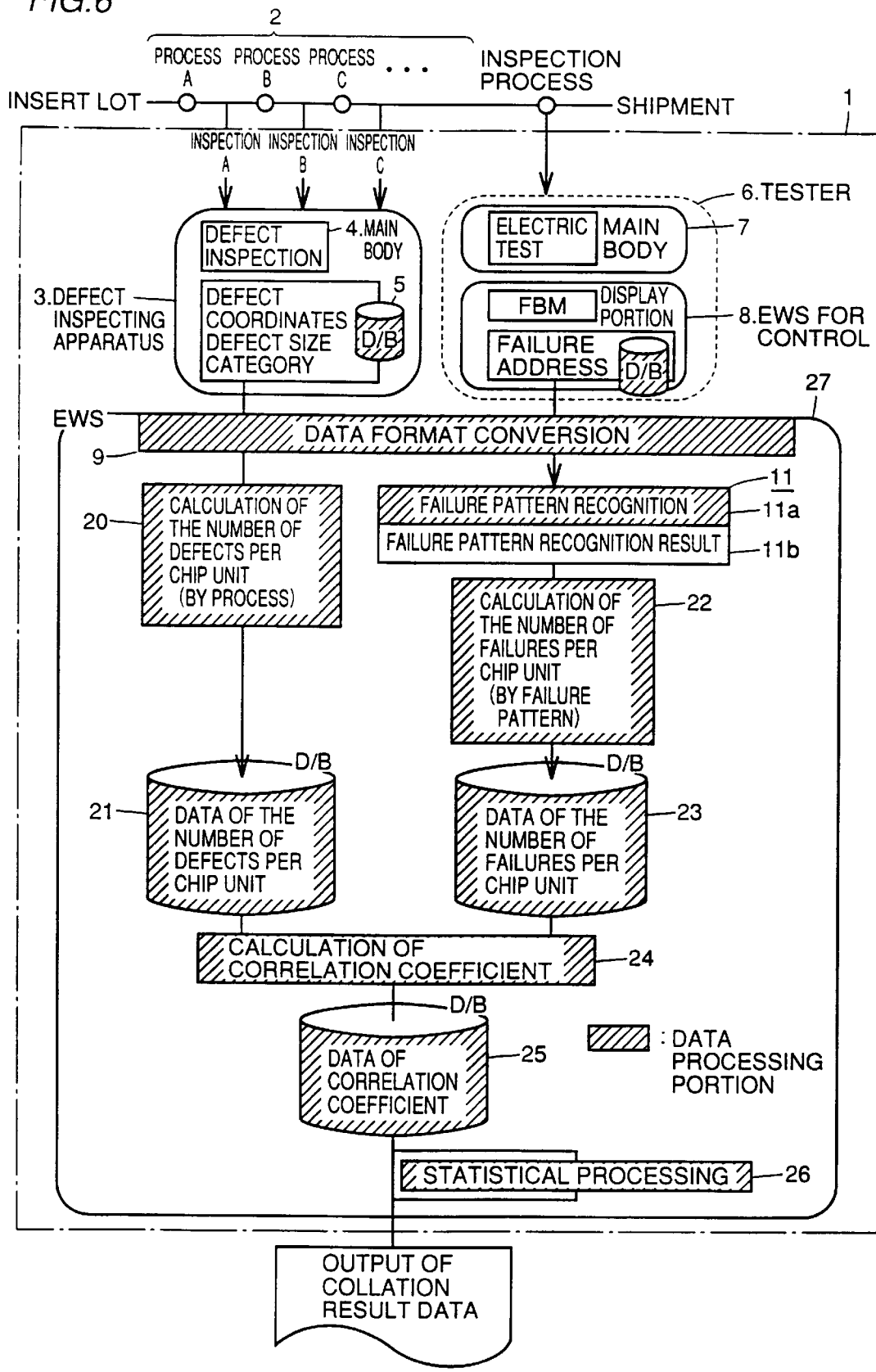
FIG. 6 is a block diagram showing a second embodiment of the present invention.

FIG. 6 is a block diagram showing an apparatus 1 for analyzing a failure in a semiconductor wafer in accordance with a second embodiment of the present invention. In FIG. 6, the same references 1–9 and 11 as those in FIG. 1 indicate the same or corresponding portions of the first embodiment, respectively. Means 20 for calculating the number of defects receives data converted by data format converting means 9 (This data is hereinafter referred to as data of defect position coordinates, for convenience. Data showing defect position coordinates contained in the data of the defect position coordinates is represented as physical position coordinates of distances X1 and Y1 (for example, μm) from the origin which is preset in a chip. Physical position coordinates also indicate which chip in the semiconductor wafer is of interest, and refer to coordinates of one or a plurality of physical positions.); calculates the number of defects per chip unit by chip and by process based on the converted data; and outputs the result as data of the number of defects per chip unit by process.

Fifth storage means 21 is a data base for accumulating (storing) data of the number of defects by process per chip unit.

Means 22 for calculating the number of failures receives failure pattern recognition result data from failure pattern recognizing means 11, calculates the number of failures by chip unit by failure pattern, and outputs the result as data of the number of failures per chip unit by failure pattern. For example, calculating means 22 calculates the number of point failures, the number of line failures, the number of plane failures and the like per chip unit, based on the failure pattern recognition result data of a point failure, a line failure, a plane failure and the like resulting from recognition and classification performed by failure pattern recognizing means 11.

Sixth storage means 23 is a data base for accumulating (storing) data of the number of failures per chip unit by failure pattern obtained from the calculating means 22.

Correlation coefficient calculating means 24 receives the data of the number of defects per chip unit by process stored in the fifth storage means 21 and the data of the number of failures per chip unit by failure pattern stored in the sixth storage means 23, collates these data with each other, and calculates correlation coefficient between these data by process and by failure pattern by performing an operation.

It is noted that collation of data in this case means collation of data of the number of defects by chip unit and data of the number of failures per chip unit with each other for each chip in the same semiconductor wafer, collation of data of defect density per chip unit obtained by dividing data of the number of defects per chip unit by chip area with data of failure density per chip unit obtained by dividing data of the number of failures per chip unit by chip area, or collation of defect distribution obtained by data of the number of defects per chip unit or data of defect density per chip unit with failure distribution obtained from data of the number of failures per chip unit or data of failure density per chip unit. Data of defect density per chip unit and data of failure density per chip unit can be applied to devices of other types having different chip size, and facilitates collation.

Correlation coefficient calculating means 24 calculate correlation coefficient as follows, for example. It is now assumed that nine chips of 3×3 are formed in a semiconductor wafer, distribution of defects detected by defect inspecting apparatus 3 in one process N is such as shown in (a) of FIG. 7, distribution (changed to a physical position) of a failure pattern of a word line obtained based on the result of the test carried out by tester 6 is such as shown in (b) of FIG. 7. Capital letters A–I shown in (a) of FIG. 7 correspond to small letters a–i shown in (b) of FIG. 7, respectively, and the same letters indicate the same chip.

Data of the number of defects per chip unit by process stored in the fifth storage means 21 shows that there are three defects in chip A, one defect in chip B and the like in process N. Furthermore, data of the number of failures per chip unit by failure pattern stored in the sixth storage means 23 shows that there are four failures of word line in chip a (corresponding to chip A), no failure of word line in chip b and the like in a failure pattern of a word line.

Figure 7:
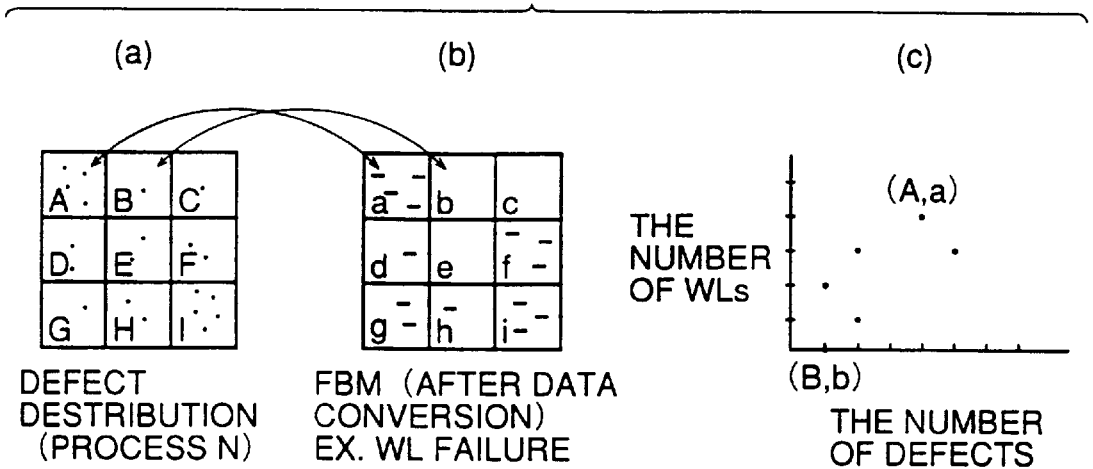
FIG. 7 is a schematic diagram illustrating how correlation coefficient is calculated by correlation coefficient calculating means 24 in accordance with the second embodiment of the present invention.

Calculating means 24 produces a scatter diagram of the number of defects and the number of failures as shown in (c) of FIG. 7, and calculates correlation coefficient between the number of defects and the number of failures from the diagram.

Seventh storage means 25 is a data base for accumulating (storing), by process and by failure pattern, correlation coefficient calculated by correlation coefficient calculating means 24, and outputs the result of collation stored therein directly to display means (not shown) as required. It is noted that the seventh storage means 25 may not output the result of collation stored therein directly to the display means.

Figure 8:
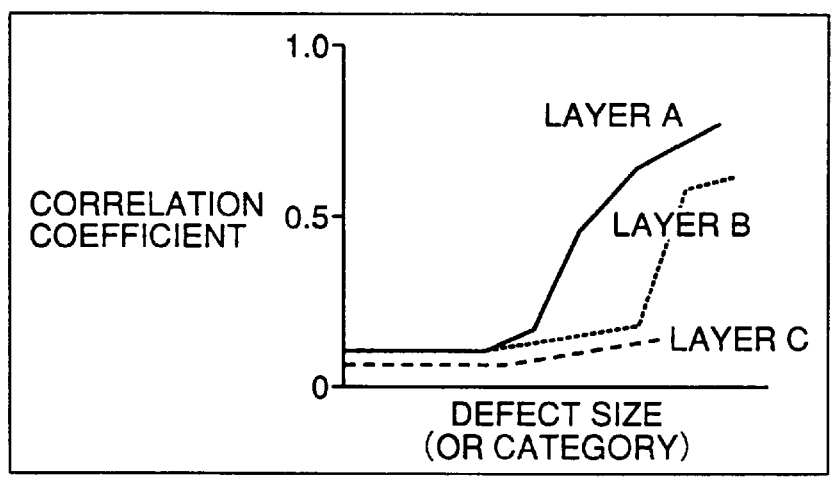
FIG. 8 is a diagram showing an example of data output from statistical processing means 26 in accordance with the second embodiment of the present invention.

Statistical processing means 26 statistically processes correlation coefficient stored in the seventh storage means 25 by semiconductor wafer, by chip, by process and by failure pattern so as to output the resultant data, and exemplary display of the result of statistic processing is shown in FIG. 8. FIG. 8 is a diagram of correlation coefficient to defect size (or defect category) for each layer (Layer A, Layer B, Layer C for each process). It can be seen from FIG. 8 that correlation coefficient closer to 1 indicates stronger correlation, showing that the defect causes a failure. In addition, whether a defect causes a failure or not can be determined depending on whether or not correlation coefficient is at least a management value which is set arbitrarily.

An analyzing apparatus 27 is constituted by a computer work station including data format converting means 9, failure pattern recognizing means 11, means 20 for calculating the number of defects, fifth storage means 21, means 22 for calculating the number of failures, sixth storage means 23, means 24 for calculating correlation coefficient, seventh storage means 25, and statistical processing means 26. This analyzing apparatus 27 receives data containing defect position coordinates obtained based on the result of physical inspection of foreign materials, defects and the like at a surface of a semiconductor wafer for each process in the production line having a plurality of processes, and fail bit data obtained based on the result of the test of an electric property of memory cells in each chip of the semiconductor wafer manufactured in the production line; produces both data of the number of defects per chip unit for each chip based on the data containing defect position coordinates and data of the number of failures per chip unit for each chip based on the fail bit data; produces correlation coefficient by collating the data of the number of defects per chip unit and the data of the number of failures per chip unit with each other; and outputs the resultant data.

Figure 9:
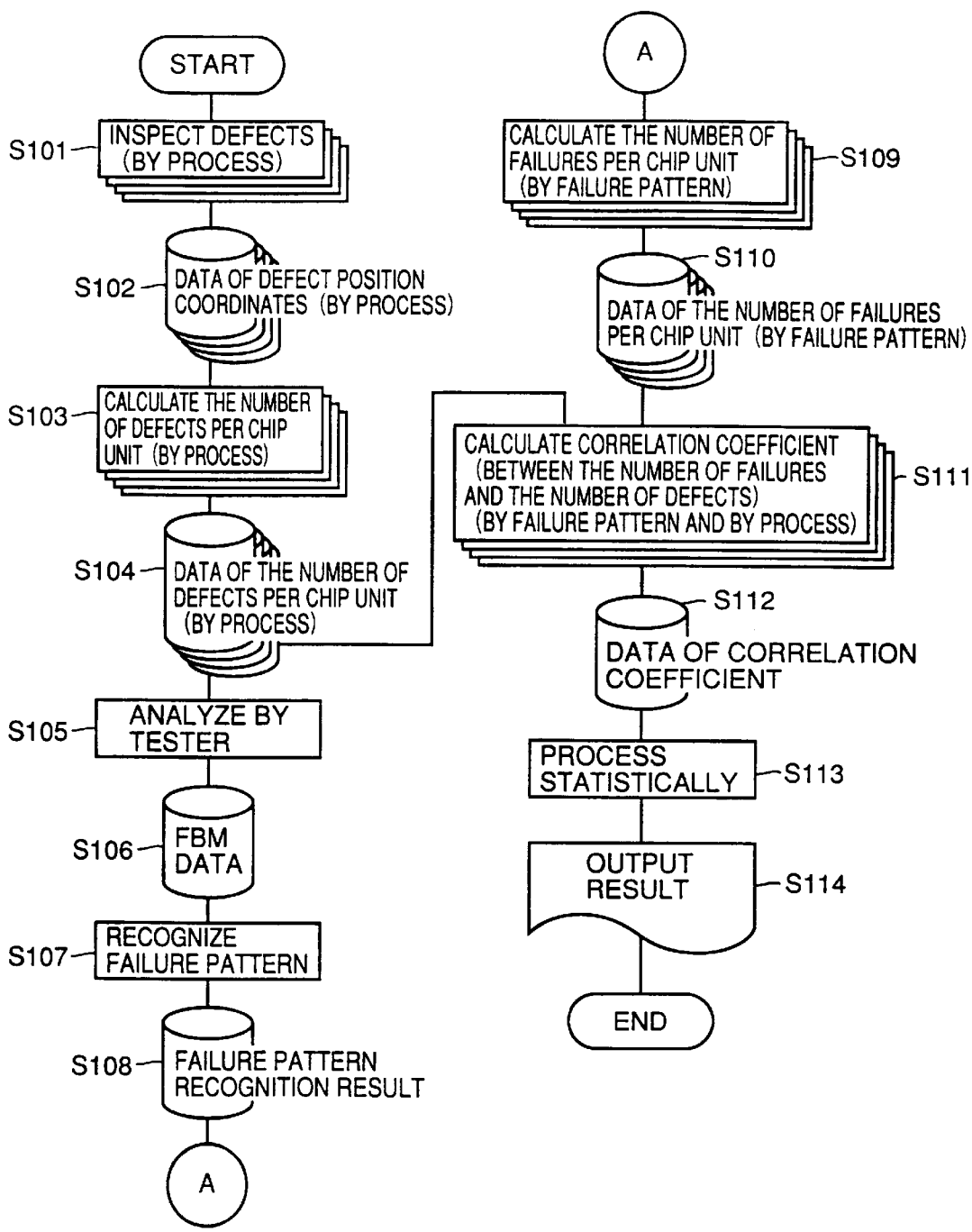
FIG. 9 is a flow chart showing processing procedure in an analyzing apparatus 27 in accordance with the second embodiment of the present invention.

A method of analyzing a failure in a semiconductor wafer by a failure analyzing apparatus having a structure as described above will now be described mainly in conjunction with a flow chart shown in FIG. 9.

First, in a step S101, a defect at the surface of the semiconductor wafer is detected by physical inspection (optical inspection) of external appearance thereof for each process A, B, C . . . of production line 1 by defect inspecting apparatus 3 to produce defect position coordinates, and then, in a step S102, the defect position coordinates are once stored in data base 5 by process or the like.

Then, the defect position coordinates obtained by defect inspecting apparatus 3 are data-converted based on a prescribed format by data format converting means 9, and calculating means 20 receives the converted data of defect position coordinates, calculates the number of defects per chip unit by process and by chip based on the data of defect position coordinates, and produces data of the number of defects per chip unit by process in a step S103.

The data of the number of defects per chip unit calculated by calculating means 20 is stored in the fifth storage means 21 in a step S104.

On the other hand, in a step S105, an electric property of memory cells in each chip of the semiconductor wafer manufactured in production line 2 is tested by tester 6 to produce an FBM as a result of the test, and the FBM data is once stored in data base 8 in a step S106.

Then, in a step S107, the FBM data obtained from tester 6 is data-converted based on a prescribed format by data format converting means 9, a failure pattern in the converted FBM data is recognized and classified by failure pattern recognizing means 11, and then stored as failure pattern recognition result data in a step S108.

At this time, in recognition and classification of a failure pattern, a failure pattern is recognized for each chip to be a point failure, a line failure, or a plane failure, based on all the failure addresses in each chip of the semiconductor wafer which are contained in the data from tester 6 of point information represented by a crossing point in a wiring matrix, and classified into a point failure, a line failure, a plane failure and the like.

Then, in a step S109, calculating means 22 calculates the number of failures per chip unit for each failure pattern, based on failure pattern recognition result data from failure pattern recognizing means 11, for example, calculates the number of point failures per chip unit, the number of line failures per chip unit and the number of plane failures per chip unit based on failure pattern recognition result data of a point failure, a line failure, a plane failure and the like obtained from failure pattern recognizing means 11, and produces data of the number of failures per chip unit by failure pattern. The data of the number of failures per chip unit calculated by calculating means 22 is stored in the sixth storage means 23 in a step S110.

Then, in a step S111, correlation coefficient calculating means 24 collates the data of the number of defects per chip unit by process stored in the fifth storage means 21 with the data of the number of failures per chip unit by failure pattern stored in the sixth storage means 23, and calculates correlation coefficient between these data by process and by failure pattern by performing an operation.

Figure 10:
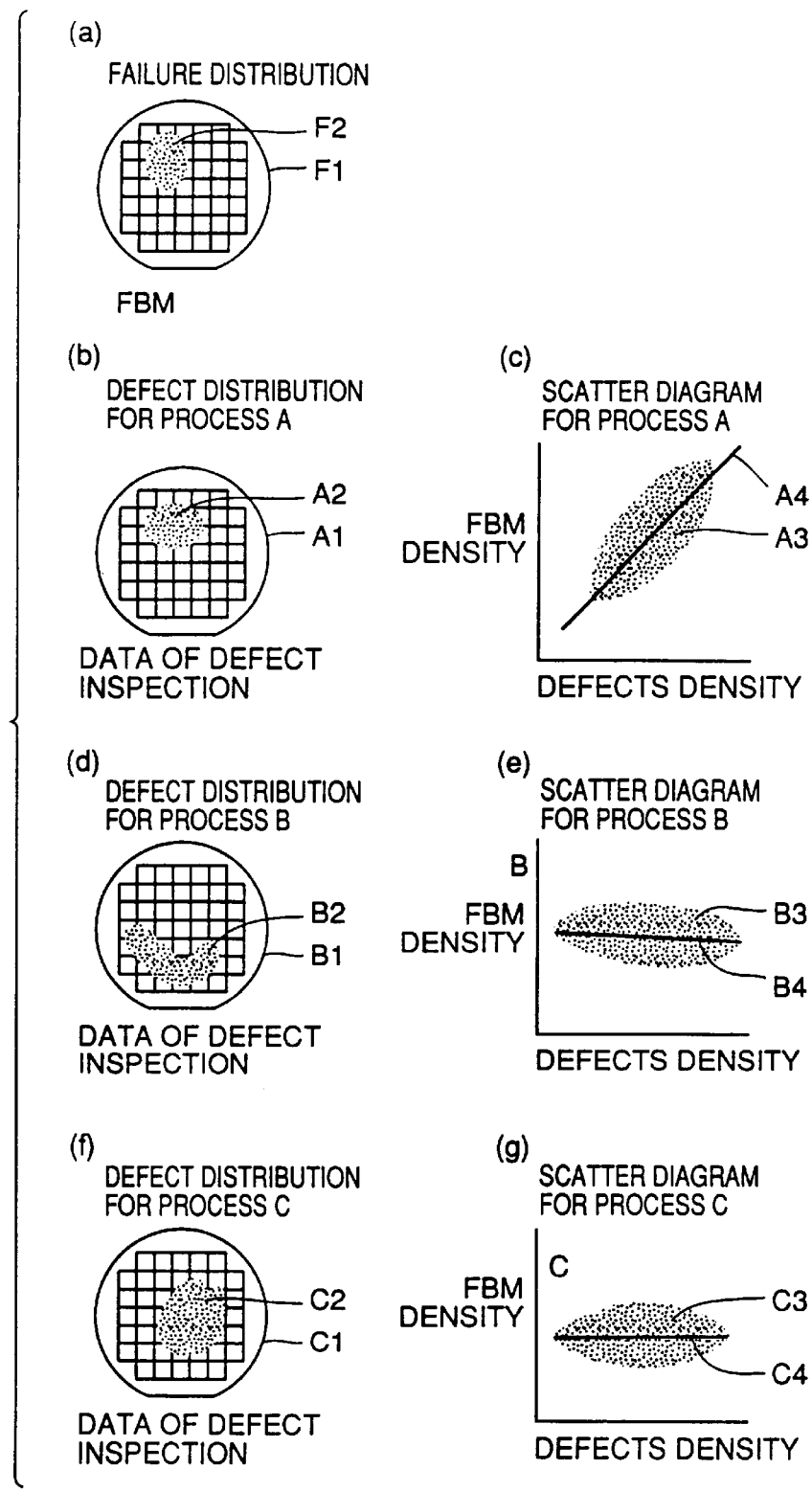
FIG. 10 is a schematic diagram illustrating how correlation coefficient is calculated by correlation coefficient calculating means 24 in accordance with the second embodiment of the present invention.

For example, correlation coefficient calculating means 24 produces defect distributions of processes A, B, and C as shown in (b), (d) and (f) of FIG. 10, respectively, by using the data of the number of defects per chip unit by process stored in the fifth storage means 21.

It is noted that in (b), (d) and (f) of FIG. 10, A1, B1 and C1 show defect maps of processes A, B and C obtained based on the data of the number of defects per chip unit, respectively, and A2, B2 and C2 show defect distribution regions on these defect maps for processes A, B and C, respectively. In addition, (b), (d) and (f) of FIG. 10 correspond to (a) of FIG. 7.

On the other hand, correlation coefficient calculating means 24 produces failure distribution based on a failure pattern as shown in (a) of FIG. 10 by using the data of the number of failures per chip unit by failure pattern stored in the sixth storage means 23.

In (a) of FIG. 10, F1 indicates a fail bit map of one failure pattern, and F2 indicates a failure distribution region of one failure pattern on the fail bit map. In addition, (a) of FIG. 10 corresponds to (b) of FIG. 7.

Then, correlation coefficient calculating means 24 correlates each of defect maps A1, B1, and C1 of respective processes A, B and C with fail bit map F1, that is, obtains relationship between each of defect distribution regions A2, B2 and C2 of respective processes A, B and C and failure distribution F2, and produces scatter diagrams of processes A, B and C as shown in (c), (e) and (g) of FIG. 10, respectively.

It is noted that in (c), (e) and (g) of FIG. 10, the abscissa indicates defect density, the ordinate indicates failure density, A3, B3 and C3 indicate scattering conditions, and A4, B4 and C4 indicate straight lines obtained from A3, B3 and C3, which are base of correlation coefficients, respectively. In addition, (c), (e) and (g) of FIG. 10 correspond to (b) of FIG. 7.

Correlation coefficient calculating means 24 calculates correlation coefficients by using scattering conditions A3, B3, C3 in scatter diagrams for processes A, B, and C, respectively. For example, correlation coefficient calculating means 24 produces straight lines A4, B4 and C4 shown in (c), (e) and (g) of FIG. 10, and calculates correlation coefficients based on inclinations of lines A4, B4 and C4, respectively.

In the example shown in (c), (e) and (g) of FIG. 10, correlation coefficient is in the range from 0.8 to 0.9 in the case of (c) of FIG. 10, and correlation coefficients are almost 0 in the case of (e) and (g) of FIG. 10, and therefore, it can be appreciated that the failure is not caused by defects in processes B and C but by defects in process A.

More specifically, by collating one failure pattern obtained from the test result from tester 6 with defects for each process detected by defect inspecting apparatus 3 and comparing correlation coefficients resulting from collation for each process with each other, a process which produces the cause of a failure of one failure pattern can be determined easily.

It is noted that whether a process which produces the cause of a failure or not may be determined not by comparing correlation coefficients of respective processes with each other but by comparing each of correlation coefficients of respective processes with a preset management value of correlation coefficient for one failure pattern.

This data of correlation coefficients is stored in the seventh storage means 25 in a step S112.

Then, in a step S113, statistical processing means 26 statistically processes the correlation coefficient data stored in the seventh storage means 25 by semiconductor wafer, by process and by failure pattern, and in step S114, outputs the resultant data in the form of a table, a graph or the like.

An apparatus for analyzing a failure in a semiconductor wafer having a structure as described above can easily determine a process which has produced defects causing a failure of a failure pattern obtained from tester 6, and can recognize defects causing the failure pattern obtained from tester 6, without mistaking defects produced in the process which does not affect the failure pattern obtained from tester 6 for the cause of the failure pattern.

Although both data of the number of defects and data of the number of failures are data per chip unit in the second embodiment, the present invention is not limited to this, data of the number of defects and the data of the number failures may be data per prescribed region unit in a chip.

In addition, although correlation coefficient is calculated by correlation coefficient calculating means 24 by means of a scatter diagram in the second embodiment, the present invention is not limited to this, and correlation coefficient may be calculated by collation of data by means of other statistical method.

[Third Embodiment]

Figure 11:
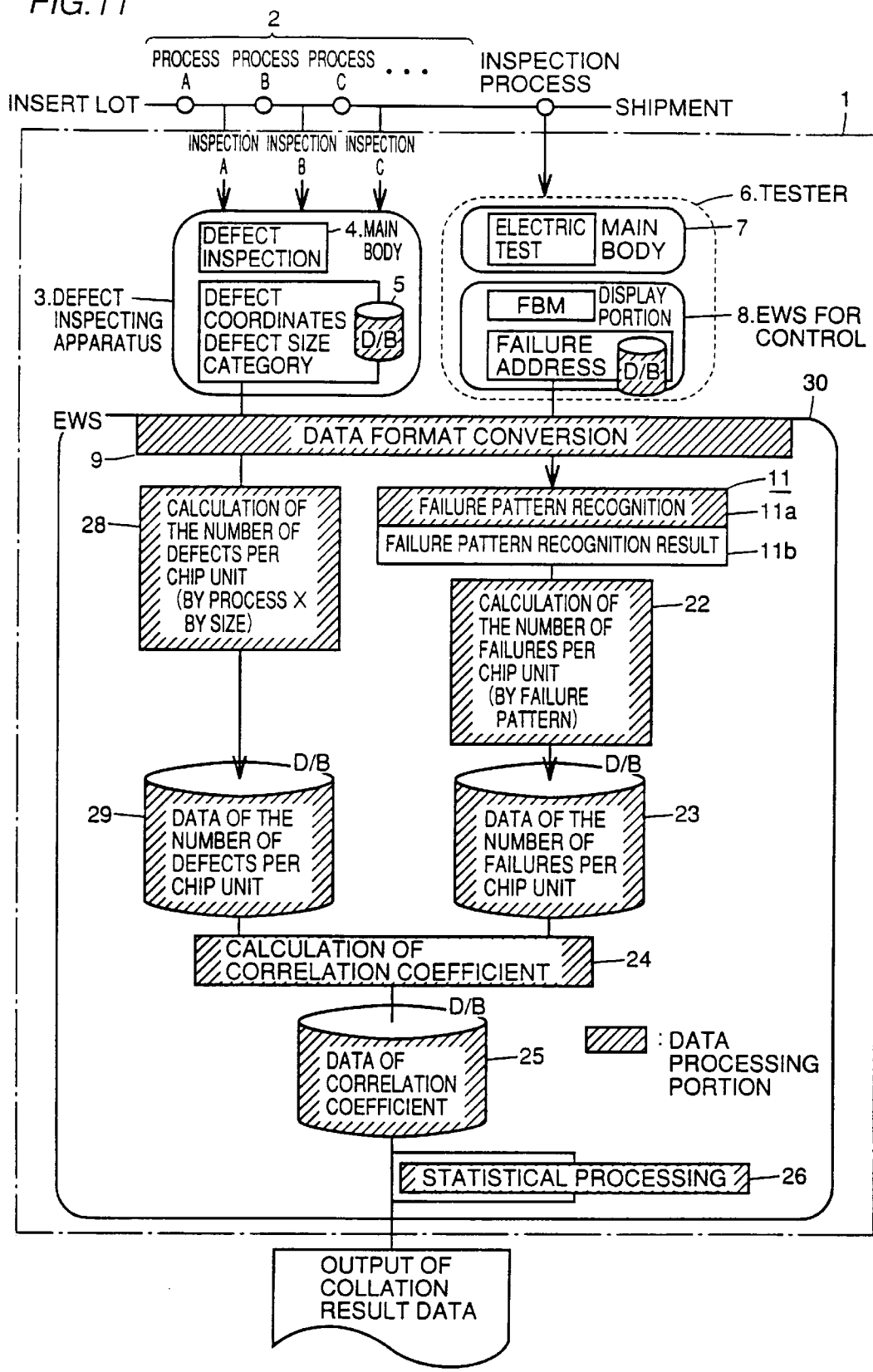
FIG. 11 is a block diagram showing a third embodiment of the present invention.

FIG. 11 is a diagram showing a third embodiment of the present invention. Defect analysis is performed by calculating the number of defects per chip unit by process and by chip, and calculating correlation coefficient based on data of the number of failures per chip unit and the data of the number of defects per chip unit by process in the second embodiment, while failure analysis is carried out by calculating, by process and by chip, the number of defects by defect size, that is, grain diameter of defects per chip unit and producing, for each process, correlation coefficient based on data of the number of failures per chip unit and data of the number of defects by size per chip unit in the third embodiment. Otherwise, the second embodiment and the third embodiment are similar to each other.

The same reference numerals 1–9, 11 and 21–26 in FIG. 11 as those in FIG. 6 showing the second embodiment indicate the same or corresponding portions of the second embodiment. Means 28 for calculating the number of defects by size receives data resulting from conversion of data from defect inspecting apparatus 3 by data format converting means 9 (Although this converted data is hereinafter referred to as data of defect position coordinates, for convenience, the data also includes information of defect size (grain diameter). In addition, data showing defect position coordinates contained in data of defect position coordinates is represented as physical position coordinates showing which chip in a semiconductor wafer is of interest and indicated by distances X1 and Y1 (for example, $\mu$m) from the origin which is preset in a chip. Physical position coordinates refer to coordinates of one or a plurality of physical positions.), calculates, by process and by chip, the number of defects by defect size (grain diameter) per chip unit based on the converted data, and outputs the resultant data as data of the number of defects by size per chip unit for each process. For example, calculating means 28 calculates the number of defects for each of grain diameter X1 $\mu$m–X2 $\mu$m (hereinafter referred to as size I), grain diameter of X2 $\mu$m–X3 $\mu$m (hereinafter referred to as size II) and grain diameter of X3 $\mu$m–X4 $\mu$m (hereinafter referred to as size III) of one chip in process A.

Eighth storage means 29 is a data base for accumulating (storing), by process and by size, data of the number of defects by size per chip unit for each process obtained from calculating means 28.

Correlation coefficient calculating means 24 receives data of the number of defects by size per chip unit for each process stored in eighth storage means 29 and data of number of failures per chip unit for each failure pattern stored in sixth storage means 23, collates these data with each other, and calculates correlation coefficient between these data for each process, each size and each failure pattern by performing an operation.

It is noted that collation of data in this case means collation of data of the number of defects by size per chip unit and data of the number of failures per chip unit with each other for each size per chip unit of the same semiconductor wafer, collation of data of defect density by size per chip unit obtained by dividing data of the number of defects by size per chip unit by chip area and data of failure density per chip unit obtained by dividing data of the number of failures per chip unit by chip area, or collation of defect distribution for each size produced by data of the number of defects by size per chip unit or data of defect density by size per chip unit with defect distribution for each size produced by data of the number of failures per chip unit or data of defect density per chip unit. The data of defect density by size per chip unit and the data of failure density per chip unit can be applied to devices of other types having different chip size, and facilitates collation.

An analyzing apparatus 30 is constituted by a computer work station including data format converting means 9, failure pattern recognizing means 11, means 28 for calculating the number of defects by size, eighth storage means 29, means 22 for calculating the number of failures, sixth storage means 23, correlation coefficient calculating means 24, seventh storage means 25, and statistical processing means 26. This analyzing apparatus 30 receives data containing defect position coordinates and defect size obtained based on the result of physical inspection of foreign materials, defects and the like at a surface of a semiconductor wafer for each process in the production line having a plurality of processes, and fail bit data obtained based on the result of the test of an electric property of memory cells in each chip of the semiconductor wafer manufactured in the production line, produces, for each chip, data of the number of defects by size per chip unit based on data containing defect position coordinates and defect size, produces, for each chip, data of the number of failures per chip unit based on the fail bit data, produces correlation coefficient by collating the data of the number of defects by size per chip unit with the data of the number of failures per chip unit, and outputs the resultant data.

Figure 12:
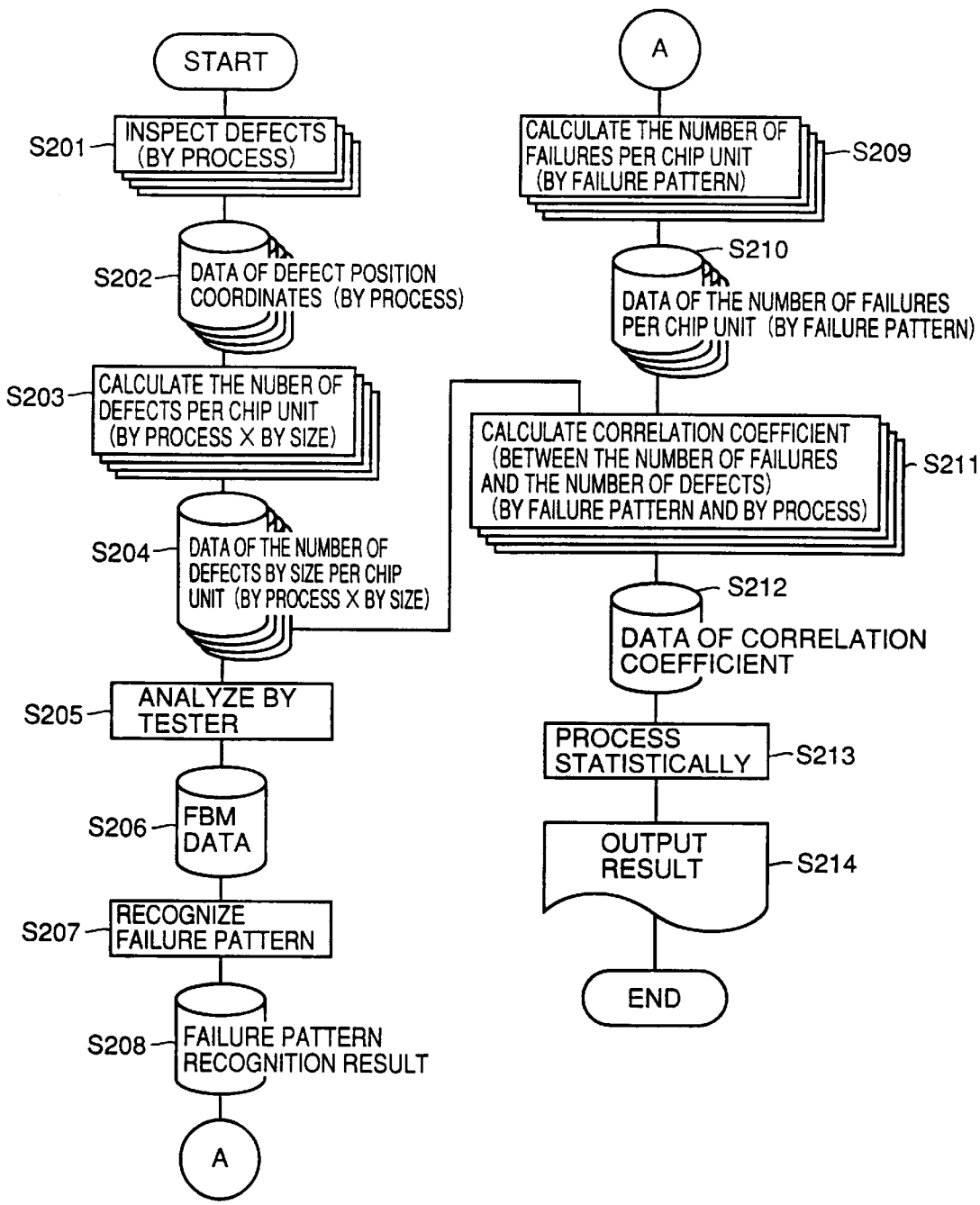
FIG. 12 is a flow chart showing processing procedure in an analyzing apparatus 30 in accordance with the third embodiment of the present invention.

A method of analyzing a failure in a semiconductor wafer by a failure analyzing apparatus having a structure as described above will now be described mainly in conjunction with a flow chart in FIG. 12.

First, in a step S201, defects at a surface of a semiconductor wafer is detected by physical inspection (optical inspection) of external appearance thereof for each process A, B, C . . . of production line 2 by defect inspecting apparatus 3, so that defect position coordinates and defect size are obtained, and then, in a step S202, the defect position coordinates and the defect size are once stored in data base 5 by process or the like.

Then, data format converting means 9 performs data-conversion of defect position coordinates and defect size obtained from defect inspecting apparatus 3 based on a prescribed format, and calculating means 28 receives the converted data of defect position coordinates containing information of defect size, calculates, for each size, each chip and each process, the number of defects by size per chip unit based on the data of defect position coordinates containing information of defect size, and produces data of the number of defects by size per chip unit for each process and each size in a step S203.

The data of the number of defects by size per chip unit calculated by calculating means 28 is stored in eighth storage means 29 in a step S204.

On the other hand, in a step S205, an electric property of memory cells in each chip of a semiconductor wafer manufactured in production line 2 is tested by tester 6, so that an FBM is obtained, and then, in a step S206, the FBM data is once stored in data base 8.

Then, in a step S207, the FBM data obtained from tester 6 is converted based on a prescribed format by data format converting means 9, a failure pattern in the converted FBM data is recognized and classified by failure pattern recognizing means 11, and then, in a step S208, the resultant data is stored as failure pattern recognition result data.

At this time, a failure pattern is recognized for each chip to be a point failure, a line failure or a plane failure based on all the failure addresses in each chip of the semiconductor wafer, which are contained in the data from tester 6 as point information represented by a crossing in a wiring matrix, and classified into a point failure, a line failure, and a plane failure and the like.

Then, in a step S209, calculating means 22 calculates the number of failures per chip unit for each failure pattern, based on failure pattern recognition result data from failure pattern recognizing means 11, for example, calculating the number of point failures per chip unit, the number of line failures per chip unit and the number of plane failures per chip unit, based on failure pattern recognition result data of a point failure, a line failure and a plane failure and the like recognized and classified by failure pattern recognizing means 11, and produces data of the number of failures per chip unit for each failure pattern. The data of the number of failures per chip unit calculated by calculating means 22 is stored in sixth storage means 23 in a step S210.

Then, in a step S211, correlation coefficient calculating means 24 collates the data of the number of defects by size per chip unit for each process and each size stored in eighth storage means 29 with the data of the number of failures per chip unit for each failure pattern stored in sixth storage means 23, and calculates correlation coefficient between these data for each process, each size and each failure pattern by performing an operation.

Figure 13:
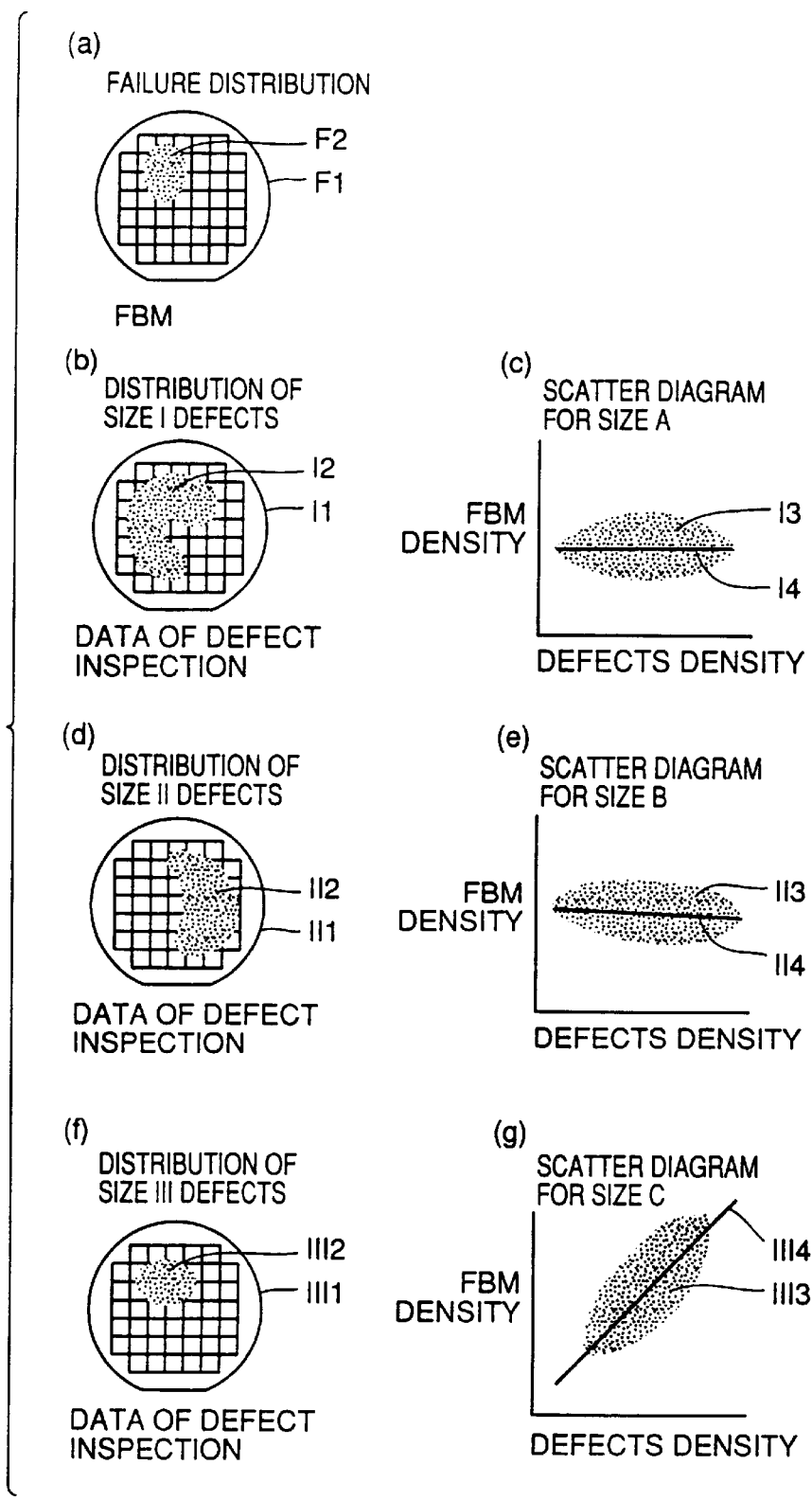
FIG. 13 is a diagram illustrating how correlation coefficient is calculated by correlation coefficient calculating means 24 in accordance with the third embodiment of the present invention.

For example, correlation coefficient calculating means 24 produces defect distributions of respective sizes I, II and III in process A as shown in (b), (d), (f) of FIG. 13 by means of the data of the number of defects by size per chip unit for each process and each size stored in eighth storage means 21.

In (b), (d) and (f) of FIG. 13, I1, II1 and III1 indicate defect maps of sizes I, II and III obtained based on data of the number of defects by size per chip unit, respectively, and I2, II2, and III2 indicate defect distribution regions on the defect maps for sizes I, II and III, respectively.

On the other hand, correlation coefficient calculating means 24 produces defect distribution based on the failure pattern as shown in (a) of FIG. 13 by using data of the number of failures per chip unit by failure pattern stored in sixth storage means 23.

In (a) of FIG. 13, F1 indicates a fail bit map for a failure pattern, and F2 indicates a failure distribution region on a fail bit map for a failure pattern.

Then, correlation coefficient calculating means 24 collates each of defect maps I1, II1, and III1 for respective sizes I, II and III with a fail bit map F1, that is, obtains relationship between each of defect distribution regions I2, II2 and III2 for respective sizes I, II, and III and failure distribution region F2, and produces scattering diagrams of sizes I, II and III as shown in (c), (e) and (g) of FIG. 13, respectively.

In (c), (e) and (g) of FIG. 13, the abscissa indicates a defect density, the ordinate indicates a failure density, I3, II3, and III3 indicate scattering conditions, and I4, II4, and III4 indicate straight lines obtained from respective scattering conditions I3, II3, and III3, which are base of correlation coefficients.

Correlation coefficient calculating means 24 calculates correlation coefficients using scattering conditions I3, II3, and III3 of the scattering diagrams for sizes, I, II and III obtained as described above, respectively. For example, correlation coefficient calculating means 24 produces straight lines I4, II4, and III4 as shown in (c), (e) and (g) of FIG. 13, and calculates correlation coefficients based on inclinations of these lines I4, II4 and III4, respectively.

In the example shown in (c), (e) and (g) of FIG. 13, since correlation coefficient of (g) of FIG. 13 is in the range from 0.8 to 0.9 and correlation coefficients of (c) and (e) of FIG. 13 are almost 0, it can be appreciated that the failure is not caused by defects of sizes I and II but by defects of sizes III.

More specifically, collation of defects by size for each process detected by defect inspecting apparatus 3 with a failure pattern obtained by a test performed by tester 6, and comparison correlation coefficients resulting from collation by size for each process make it possible to determine the size which produces the cause of a failure for a failure pattern easily. As a result, a degree to which defect size affects a failure pattern can be extracted, the defect size to be managed and defect size for which failure preventive measures is to be taken are clarified, whereby management and prevention of failure can be facilitated.

Although a defect size which produces the cause of a failure is determined by comparing correlation coefficients for each size in the present embodiment, it is also possible to determine whether a defect size produces the cause of a failure or not by comparing correlation coefficients for each size and a preset management value of the correlation coefficients for a failure pattern.

The data of correlation coefficients obtained is stored in seventh storage means 25 in a step S212.

Then, in a step S213, the data of correlation coefficient stored in seventh storage means 25 is statistically processed by semiconductor wafer, by process, by size and by failure pattern by statistical processing means 26, and in a step S214, the result is output in the form of a table, a graph or the like.

According to an apparatus for analyzing a failure in a semiconductor wafer having a structure as described above, the defect size which causes a failure pattern obtained from tester 6 can be analyzed easily, and defects which cause the failure pattern obtained from tester 6 can be recognized without mistaking a defect having a size which does not affect the failure pattern obtained from tester 6 for the cause of the failure.

Although data of the number of defects by size and data of the number of failures are data per chip unit in the third embodiment, the present invention is not limited to this, these data may be data per prescribed region unit in a chip.

In addition, although correlation coefficients are calculated by correlation coefficient calculating means 24 by means of scattering diagrams showing scattering conditions in the third embodiment, the present invention is not limited to this, and correlation coefficients may be calculated by collation of these data by means of other statistical method.

[Fourth Embodiment]

Figure 14:
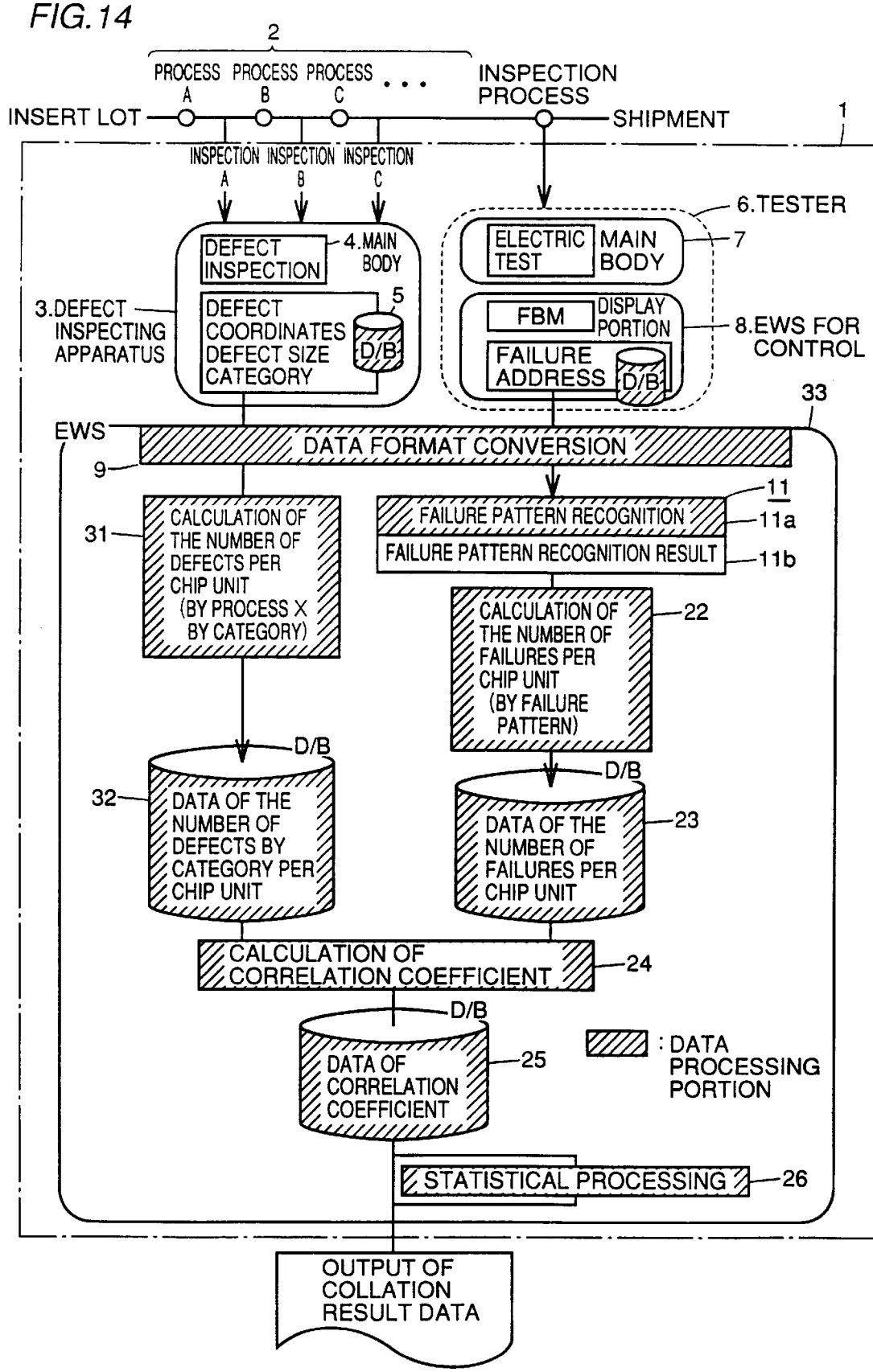
FIG. 14 is a block diagram showing a fourth embodiment of the present invention.

FIG. 14 is a diagram showing a fourth embodiment of the present invention. Failure analysis is carried out by calculating the number of defects per chip unit for each chip and each process, and producing correlation coefficients based on data of the number of failures per chip unit and data of the number of defects per chip unit for each process in the second embodiment, while failure analysis is carried out by classifying defects into categories of defect shapes by chip unit for each process and each chip, for example, classifying defects into categories such as a pattern defect or a foreign material, a protrusion or a recess, a smooth surface or a rough surface, and the like, calculating the number of defects for each category, and producing correlation coefficients based on data of the number of failures per chip unit and data of the number of defects for each category per chip unit for each process in the fourth embodiment. Otherwise, the second embodiment and the fourth embodiment are similar to each other.

The same references 1–9, 11 and 21–26 in FIG. 14 as those in FIG. 6 of the second embodiment indicate the same or corresponding portions of the second embodiment. Means 31 for calculating the number of defects for each category receives data resulting from data conversion performed by data format converting means 9 (including an optical microscope and an SEM observing apparatus) (Although this converted data is hereinafter referred to as data of defect position coordinates, the data also includes information of category size as described above. In addition, data showing defect position coordinates contained in the data of defect position coordinates is represented as physical position coordinates indicated by distances X1 and Y1 (for example, μm) from the origin which is preset in a chip and indicating which chip in a semiconductor wafer is of interest, and physical position coordinates refers generitically to coordinates of one or a plurality of physical positions.); calculates the number of defects for each category per chip unit for each chip and for each process based on these data; and outputs the resultant data as data of the number of defects by category per chip unit for each process. For example, this calculating means 31 calculates the number of recesses, the number of protrusions, the number of rough surfaces and the like.

Ninth storage means 32 is a data base for accumulating (storing), by process and by category, data of the number of defects by category by chip unit for each process obtained from the calculating means 31.

Correlation coefficient calculating means 24 receives data of the number of defects by category per chip unit for each process stored in ninth storage means 32 and data of the number of failures per chip unit for each failure pattern stored in sixth storage means 23, collates these data with each other, and calculates correlation coefficients between these data for each process, each category, and each failure pattern by performing an operation.

Collation of data in this case means collation of data of the number of failures per chip unit and data of the number of defects by category by chip unit with each other for each category per chip unit in the same semiconductor wafer, collation of data of defect density by category per chip unit obtained by dividing data of the number of defects by category per chip unit by chip area with data of failure density per chip unit obtained by dividing data of the number of failures per chip unit by chip area, or collation of defect distribution by category obtained based on data of the number of defects by category by chip unit or data of defect density by category by chip unit with failure distribution obtained by data of the number of failures per chip unit or data of failure density per unit. The data of defect density by category per chip unit and the data of failure density per chip unit can be applied to devices of other types having different chip size, and facilitates collation.

An analyzing apparatus 33 is constituted by a computer work station including data format converting means 9, failure pattern recognizing means 11, means 31 for calculating the number of failures by category, ninth storage means 32, means 22 for calculating the number of failures, sixth storage means 23, correlation coefficient calculating means 24, seventh storage means 25 and statistical processing means 26. This analyzing apparatus 33 receives data including categories and defect position coordinates obtained based on the result of physical inspection of foreign materials, defects and the like at a surface of a semiconductor wafer for each process in the production line having a plurality of processes, and fail bit data obtained based on the test result of an electric property of memory cells in each chip of the semiconductor wafer manufactured in the production line; produces data of the number of defects by category per chip unit for each chip and each category based on data containing defect position coordinates and categories; produces data of the number of failures per chip unit for each chip based on the fail bit data; calculates correlation coefficients by collation of the data of the number of defects by category per chip unit with the data of the number of failures per chip unit; and outputs the resultant data.

Figure 15:
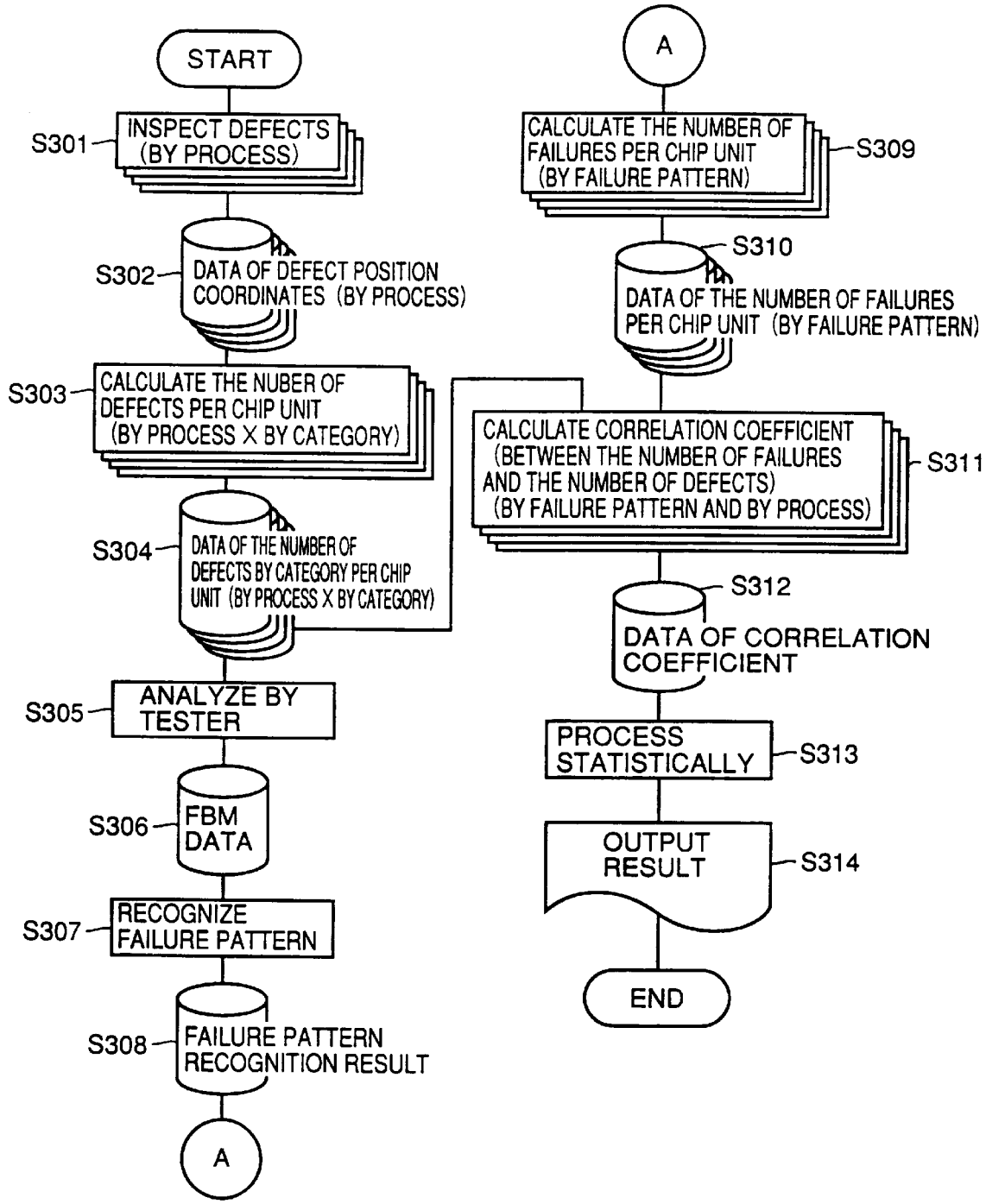
FIG. 15 is a flow chart showing processing procedure in an analyzing apparatus 33 in accordance with the fourth embodiment of the present invention.

A method of analyzing a failure in a semiconductor wafer by a failure analyzing apparatus having a structure as described above will now be described mainly in conjunction with a flow chart shown in FIG. 15.

First, in a step S301, defects at the surface of the semiconductor wafer are detected by physical inspection (optical inspection) of external appearance thereof by defect inspecting apparatus 3 for each process A, B, C . . . of production line 2 to obtain defect position coordinates and categories of defect shapes, and then, in a step S302, the defect position coordinates and the categories are once stored in data base 5 for each process or the like.

Then, the defect position coordinates and the categories obtained from defect inspecting apparatus 3 are data-converted by data format converting means 9 based on a prescribed format, and the resultant data of defect position coordinates containing information of categories of defect shapes is received by calculating means 31, and in a step S303, the number of defects by category per chip unit is calculated for each chip, each process and each category by calculating means 31 based on the data of defect position coordinates containing category information, whereby data of the number of defects by category per chip unit is provided for each process and each category.

The data of the number of defects by category per chip unit calculated by calculating means 31 is stored in ninth storage means 32 in a step S304.

On the other hand, in a step S305, an electric property of memory cells in each chip of the semiconductor wafer manufactured in production line 2 is tested by tester 6, and an FBM is obtained as a result, and in a step S306, the FBM data is once stored in data base 8.

Then, in a step S307, the FBM data obtained from tester 6 is data-converted based on a prescribed format by data format converting means 9, a failure pattern in the resultant FBM data is recognized and classified by failure pattern recognizing means 11, and the resultant data is stored as failure pattern recognition result data in a step S308.

At this time, a failure pattern is recognized for each chip to be a point failure, a line failure or a plane failure based on all the failure addresses in each chip of the semiconductor wafer, which are contained in the data from tester 6 as point information indicated by a crossing point in a wring matrix, and classified into a point failure, a line failure, a plane failure and the like.

Then, in a step S309, calculating means 22 calculates the number of failures per chip unit for each failure pattern based on the failure recognition result data from failure pattern recognizing means 11, for example, calculates the number of point failures per chip unit, the number of line failures per chip unit and the number of plane failures per chip unit based on the failure pattern recognition result data of a point failure, a line failure, a plane failure and the like recognized and classified by failure pattern recognizing means 11, and produces data of the number of failures per chip unit for each failure pattern. The data of the number of failures per chip unit calculated by calculating means 22 is stored in sixth storage means 23 in a step S310.

Then, in a step S311, correlation coefficient calculating means 24 collates the data of the number of defects by category per chip unit for each process and each category stored in ninth storage means 32 with the data of the number of failures per chip unit by failure pattern stored in sixth storage means 23, and calculates correlation coefficient between these data for each process, each category and each failure pattern by performing an operation.

For example, correlation coefficient calculating means 24 produces defect distribution for one process using the data of the number of defects by category per chip unit for each process stored in ninth storage means 32.

On the other hand, correlation coefficient calculating means 24 produces failure distribution based on a failure pattern, using the data of the number of failures per chip unit for each failure pattern stored in sixth storage means 23.

Then, correlation coefficient calculating means 24 collates defect distribution with failure distribution for each category, thereby producing a scatter diagram for each category.

Correlation coefficient calculating means 24 calculates correlation coefficient using a scattering condition in the scatter diagram for each category obtained as described above.

More specifically, defects for each defect shape category for each process detected by defect inspecting apparatus 3 is collated with a failure pattern obtained from the test result of tester 6, and correlation coefficients resulting from collation for each category and each process are compared to each other, whereby a category which causes a failure of the failure pattern can be determined easily. Consequently, a degree to which each category affects a failure of the failure pattern can be extracted, a category to be managed and a category for which failure preventive measures is to be taken are clarified, whereby management and failure prevention can be facilitated.

Although a category which produces the cause of a failure is recognized by comparing correlation coefficients for respective categories with each other in the present embodiment, it is also possible to determine whether a category produces the cause of a failure or not by comparing correlation coefficient for each category and a preset management value of correlation coefficient for a failure pattern with each other.

The data of correlation coefficient obtained as described above is stored in seventh storage means 25 in a step S312.

Then, in a step S313, statistical processing means 26 statistically processes the data of correlation coefficient stored in seventh storage means 25 by semiconductor wafer, by process, by category and by failure pattern, and in a step S314, outputs the resultant data in a form of a table, a graph or the like.

According to an apparatus for analyzing a failure in a semiconductor wafer having a structure as described above, a defect category which produces the cause of a failure in a failure pattern obtained from tester 6 can be analyzed easily, and a defect which causes a failure pattern obtained by tester 6 can be determined without mistaking a defect of a category which does not affect the failure pattern obtained from tester 6 for the cause of the failure.

Although both data of the number of defects by category and data of the number of failures are data per chip unit in the fourth embodiment, the present invention is not limited to this, and these data may be data per prescribed region unit in a chip.

In addition, although correlation coefficients are calculated based on scatter diagrams by correlation coefficient calculating means 24 in the fourth embodiment, the present invention is not limited to this, and correlation coefficients can also be obtained by collating these data with each other using other statistical methods.

Furthermore, although separate failure analyzing apparatuses are shown in the first to fourth embodiments, respectively, these failure analyzing apparatuses may be constructed integrally so that functions of the apparatuses of the first to fourth embodiments can be switched.

More specifically, an analyzing apparatus may be constructed by a computer work station having all the functions of analyzing apparatuses 19, 27, 30 and 33 of respective embodiments and capable of switching their functions depending on a method of failure analysis, and all the data from defect inspecting apparatus 3 and tester 6 are stored in such an analyzing apparatus so that all the functions of the first to fourth embodiments can be performed.

Furthermore, in this case, only one analyzing apparatus which can be used in common among the first to fourth embodiments is needed, and in such an apparatus, elements having functions equivalent to each other such as storage means 10, 21, 29 and 32 can be formed integrally.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for analyzing a failure in a semiconductor wafer, comprising:
   defect calculating means for calculating the number of defects per prescribed unit, based on data containing defect position coordinates obtained from a result of physical inspection of a foreign material, a defect and the like at a surface of a semiconductor wafer for each process in a production line having a plurality of processes, and outputting a resultant value as data of the number of defects per prescribed unit;
   failure calculating means for calculating the number of failures per said prescribed unit, based on fail bit data obtained from a result of test of an electric property of memory cells in each chip of the semiconductor wafer manufactured in said production line, and outputting a resultant value as data of the number of failures per prescribed unit; and
   correlation coefficient calculating means for receiving said data of the number of defects per prescribed unit and said data of the number of failures per prescribed unit, collating said data of the number of defects per prescribed unit with said data of the number of failures per prescribed unit, and calculating correlation coefficient between said collated data by performing an operation.

2. An apparatus for analyzing a failure in a semiconductor wafer, comprising:
   defect calculating means for receiving data containing defect position coordinates based on a result of physical inspection of a foreign material, a defect and the like at a surface of a semiconductor wafer for each process in a production line having a plurality of processes, calculating the number of defects per prescribed unit based on said data containing defect position coordinates, and outputting a resultant value as data of the number of defects per prescribed unit;
   first storage means for storing said data of the number of defects per prescribed unit from said defect calculating means;
   failure calculating means for receiving fail bit data based on a result of test of an electric property of memory cells in each chip of the semiconductor wafer manufactured in said production line, calculating the number of failures per said prescribed unit based on said fail bit data, and outputting a resultant value as data of the number of failures per prescribed unit;
   second storage means for storing said data of the number of failures per prescribed unit from said failure calculating means; and
   correlation coefficient calculating means for receiving said data of the number of defects per prescribed unit stored in said first storage means and said data of the number of failures per prescribed unit stored in said second storage means, collating said data of the number of defects per prescribed unit with said data of the number of failures per prescribed unit, and calculating correlation coefficient between said collated data by performing an operation.

3. An apparatus for analyzing a failure in a semiconductor wafer, comprising:
   defect calculating means for calculating the number of defects such as a foreign material, a defect or the like per prescribed unit by size, based on data containing defect position coordinates and defect size obtained from a result of physical inspection of a foreign material, a defect and the like at a surface of a semiconductor wafer for each process in a production line having a plurality of processes, and outputting a resultant value as data of the number of defects by size per prescribed unit;
   failure calculating means for calculating the number of failures per said prescribed unit, based on fail bit data obtained from a result of test of an electric property of memory cells in each chip of the semiconductor wafer manufactured in said production line, and outputting a resultant value as data of the number of failures per prescribed unit; and
   correlation coefficient calculating means for receiving said data of the number of defects by size per prescribed unit and said data of the number of failures per prescribed unit, collating said data of the number of defects by size per prescribed unit with said data of the number of failures per prescribed unit, and calculating correlation coefficient between said collated data by performing an operation.

4. An apparatus for analyzing a failure in a semiconductor wafer, comprising:
   defect calculating means for receiving data containing defect position coordinates and defect size obtained based on a result of physical inspection of a foreign material, a defect and the like at a surface of a semiconductor wafer for each process in a production line having a plurality of processes, calculating the number of defects such as a foreign material, a defect and the like by size per prescribed unit, based on said data containing defect position coordinates and defect size, and outputting a resultant value as data of the number of defects by size per prescribed unit;
   first storage means for storing said data of the number of defects by size per prescribed unit from said defect calculating means;
   failure calculating means for receiving fail bit data based on a result of test of an electric property of memory cells in each chip of the semiconductor wafer manufactured in said production line, calculating the number of failures per said prescribed unit based on said fail bit data, and outputting a resultant value as data of the number of failures per prescribed unit;
   second storage means for storing said data of the number of failures per prescribed unit from said failure calculating means; and
   correlation coefficient calculating means for receiving said data of the number of defects by size per prescribed unit stored in said first storage means and said data of the number of failures per prescribed unit stored in said second storage means, collating said data of the number of defects by size per prescribed unit with said data of the number of failures per prescribed unit, and calculating correlation coefficient between said collated data by performing an operation.

5. An apparatus for analyzing a failure in a semiconductor wafer, comprising:
   defect calculating means for calculating the number of defects such as a foreign material, a defect and the like by category per prescribed unit, based on data containing defect position coordinates and defect shape category obtained from a result of physical inspection of a foreign material, a defect and the like at a surface of a semiconductor wafer for each process of a production line having a plurality of processes, and outputting a resultant value as data of the number of defects by category per prescribed unit;

failure calculating means for calculating the number of failures per said prescribed unit, based on fail bit data obtained from a result of test of an electric property of memory cells in each chip of the semiconductor wafer manufactured in said production line, and outputting a resultant value as data of the number of failures per prescribed unit; and correlation coefficient calculating means for receiving said data of the number of defects by category per prescribed unit and said data of the number of failures per prescribed unit, collating said data of the number of defects by category per prescribed unit with said data of the number of failures per prescribed unit, and calculating correlation coefficient between said collated data by performing an operation.

6. An apparatus for analyzing a failure in a semiconductor wafer, comprising:

defect calculating means for receiving data containing defect position coordinates and defect shape category obtained based on a result of physical inspection of a foreign material, a defect and the like at a surface of the semiconductor wafer for each process in a production line having a plurality of processes, calculating the number of defects such as a foreign material, a defect and the like by category per prescribed unit, based on said data containing defect position coordinates and defect shape category, and outputting a resultant value as data of the number of defects by category per prescribed unit;

first storage means for storing said data of the number of defects by category per prescribed unit from said defect calculating means;

failure calculating means for receiving fail bit data obtained based on a result of test of an electric property of memory cells in each chip of the semiconductor wafer manufactured in said production line, calculating the number of failures per said prescribed unit based on said fail bit data, and outputting a resultant value as data of the number of failures per prescribed unit;

second storage means for storing said data of the number of failures per prescribed unit from said failure calculating means; and correlation coefficient calculating means for receiving said data of the number of defects by category per prescribed unit stored in said first storage means and said data of the number of failures per prescribed unit stored in said second storage means, collating said data of the number of defects by category per prescribed unit with said data of the number of failures per prescribed unit, and calculating correlation coefficient between said collated data by performing an operation.

7. A method of analyzing a failure in a semiconductor wafer, comprising the steps of:

introducing data containing defect position coordinates obtained based on a result of physical inspection of a foreign material, a defect and the like at a surface of the semiconductor wafer for each process in a production line having a plurality of processes;

calculating the number of defects per prescribed unit based on said data containing defect position coordinates to produce data of the number of defects per prescribed unit;

introducing fail bit data obtained based on a result of test of an electric property of memory cells in each chip of the semiconductor wafer manufactured in said production line;

calculating the number of failures per said prescribed unit based on said fail bit data to produce data of the number of failures per prescribed unit; and collating said data of the number of defects per prescribed unit with said data of the number of failures per prescribed unit to calculate correlation coefficient between said collated data.

8. A method of analyzing a failure in a semiconductor wafer, comprising the steps of:

introducing data containing defect position coordinates and defect size obtained based on a result of physical inspection of a foreign material, a defect and the like at a surface of the semiconductor wafer for each process in a production line having a plurality of processes;

calculating the number of defects such as a foreign material, a defect and the like by size per prescribed unit, based on said data containing defect position coordinates and defect size to produce data of the number of defects by size per prescribed unit;

introducing fail bit data based on a result of test of an electric property of memory cells in each chip of the semiconductor wafer manufactured in said production line;

calculating the number of failures per said prescribed unit based on said fail bit data, to produce data of the number of failures per prescribed unit; and collating said data of the number of defects by size per prescribed unit with said data of the number of failures per prescribed unit to calculate correlation coefficient between said collated data.

9. A method of analyzing a failure in a semiconductor wafer, comprising the steps of:

introducing data containing defect position coordinates and defect shape category obtained based on a result of physical inspection of a foreign material, a defect and the like at a surface of a semiconductor wafer for each process in a production line having a plurality of processes;

calculating the number of defects such as a foreign material, a defect and the like by category per prescribed unit based on said data containing defect position coordinates and category to produce data of the number of defects by category per prescribed unit;

introducing fail bit data obtained based on a result of test of an electric property of memory cells in each chip of the semiconductor wafer manufactured in said production line;

calculating the number of failures per said prescribed unit based on said fail bit data to produce data of the number of failures per prescribed unit; and collating said data of the number of defects by category per prescribed unit with said data of the number of failures per prescribed unit to calculate correlation coefficient between said collated data.

* * * * *